US012690497B2

(12) United States Patent
Nogawa

(10) Patent No.: US 12,690,497 B2
(45) Date of Patent: Jul. 21, 2026

(54) SEMICONDUCTOR MODULE

(71) Applicant: FUJI ELECTRIC CO., LTD.,
Kawasaki (JP)

(72) Inventor: Hiroyuki Nogawa, Matsumoto-city (JP)

(73) Assignee: FUJI ELECTRIC CO., LTD.,
Kawasaki (JP)

( * ) Notice: Subject to any disclaimer, the term of this patent is extended or adjusted under 35 U.S.C. 154(b) by 372 days.

(21) Appl. No.: 18/343,244

(22) Filed: Jun. 28, 2023

(65) Prior Publication Data

US 2024/0030211 A1    Jan. 25, 2024

(30) Foreign Application Priority Data

Jul. 21, 2022    (JP) ................................. 2022-116360

(51) Int. Cl.
*H10W 90/00*        (2026.01)
*H10W 20/43*        (2026.01)
*H10W 70/60*        (2026.01)

(52) U.S. Cl.
CPC ........... *H10W 90/00* (2026.01); *H10W 20/43* (2026.01); *H10W 70/611* (2026.01); *H10W 90/401* (2026.01); *H10W 90/701* (2026.01); *H10W 90/753* (2026.01)

(58) Field of Classification Search
CPC ............................... H10W 90/00; H01L 25/18
See application file for complete search history.

(56) References Cited

U.S. PATENT DOCUMENTS

2013/0105960 A1* 5/2013 Jones ..................... H10W 90/00
                                                                    257/690
2017/0338162 A1* 11/2017 Cottet ............... H10W 70/6875

FOREIGN PATENT DOCUMENTS

| JP | 03-145755 A | 6/1991 |
| JP | 8-78620 A | 3/1996 |
| JP | 2001-94035 A | 4/2001 |
| JP | 2005-252305 A | 9/2005 |
| JP | 2006-210586 A | 8/2006 |
| JP | 2011-249394 A | 12/2011 |

OTHER PUBLICATIONS

Japanese Office Action issued in corresponding Japanese Application No. 2022-116360 mailed May 26, 2026.

* cited by examiner

*Primary Examiner* — Dale E Page
*Assistant Examiner* — Krishna J Palaniswamy

(57)                ABSTRACT

A semiconductor module includes at least, a conductive pattern on the insulating substrate; a first semiconductor element on the conductive pattern, a second semiconductor element on the conductive pattern, a first power collecting portion connected to a first output electrode of the first semiconductor element with a first line; and a second power collecting portion connected to a second output electrode of the second semiconductor element with a second line. Each of the first and second semiconductor elements includes both a switching element and a diode. The conductive pattern is provided between the first power collecting portion and the second power collecting portion. A current path length from a first output electrode of the first semiconductor element to the first power collecting portion and a current path length from a second output electrode of the second semiconductor element to the second power collecting portion are equal to each other.

8 Claims, 13 Drawing Sheets

SEMICONDUCTOR MODULE

CROSS REFERENCE TO RELATED APPLICATION

This application claims priority from Japanese Patent Application No. 2022-116360, which was filed on Jul. 21, 2022, the entire contents of which are incorporated herein by reference.

BACKGROUND OF THE INVENTION

Field of the Invention

The present disclosure relates to semiconductor modules.

Description of Related Art

For example, a semiconductor module is known for use in a power convertor, such as an inverter. This semiconductor module has, for example, semiconductor elements including an IGBT (Insulated Gate Bipolar Transistor), a power MOS-FET (Metal Oxide Semiconductor Field Effect Transistor), a PiN diode, or an SBD (Schottky Barrier Diode). A semiconductor device described in Japanese Patent Application Laid-Open Publication No. 2005-252305 is cited as an example of the semiconductor module.

The semiconductor device described in Japanese Patent Application Laid-Open Publication No. 2005-252305 includes a plurality of semiconductor elements being MOS-FETs, and an external electrode. Each of the semiconductor elements has a drain electrode formed on the lower surface, and a source electrode and a gate electrode formed on the upper surface. The source electrode is electrically connected to the external electrode. In the semiconductor device, the semiconductor elements are arranged in a line on a metal block.

SUMMARY

In Japanese Patent Application Laid-Open Publication No. 2005-252305, the semiconductor elements are arranged in a line on the metal block and there are semiconductor elements closer to the external electrode and semiconductor elements farther from the external electrode. Thus, the current path length to the external electrode differs among the semiconductor elements. The internal resistance and the inductance become non-uniform, which may cause current imbalance among the semiconductor elements.

In order to solve the above problems, a semiconductor module according to a preferred embodiment of the present disclosure includes: an insulating substrate; a conductive pattern on the insulating substrate; a first semiconductor element on the conductive pattern, the first semiconductor element including a first input electrode, a first output electrode, and a first control electrode; a second semiconductor element on the conductive pattern, the second semiconductor element including a second input electrode, a second output electrode, and a second control electrode; a first power collecting portion electrically connected to the first output electrode with a first line; and a second power collecting portion electrically connected to the second output electrode with a second line, in which each of the first semiconductor element and the second semiconductor element includes both a switching element and a diode, the conductive pattern is provided between the first power collecting portion and the second power collecting portion, and a current path length from the first output electrode to the first power collecting portion and a current path length from the second output electrode to the second power collecting portion are equal to each other.

According to the present invention, current imbalance among the first semiconductor element and the second semiconductor element can be suppressed. As a result, deviation in the temperature between the first semiconductor element and the second semiconductor element is suppressed. This enables the reliability of the semiconductor module to be enhanced.

DESCRIPTION OF THE EMBODIMENTS

Figure 1:
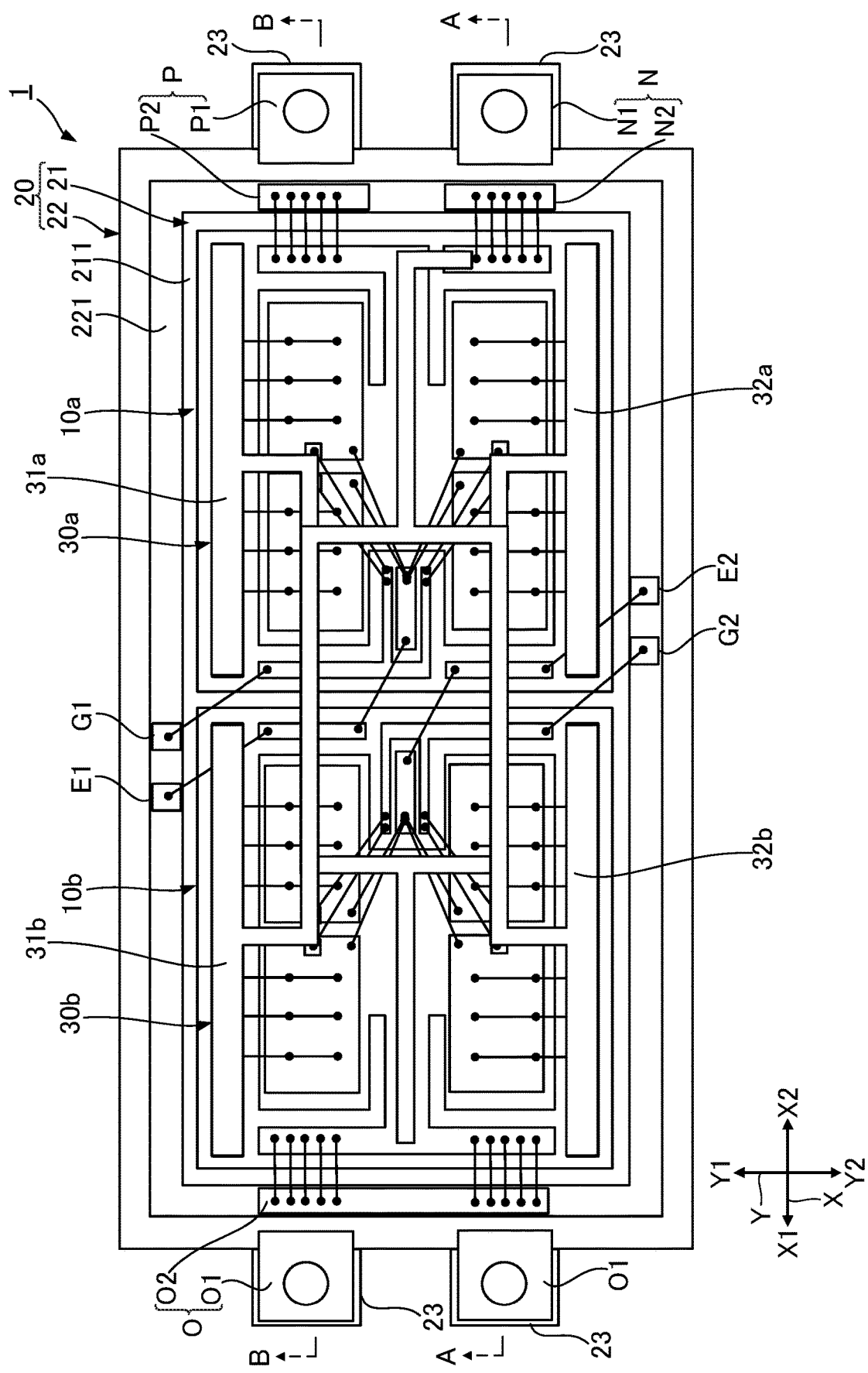
FIG. 1 is a plan view of a semiconductor module according to a first embodiment.

Preferred embodiments according to the present disclosure are explained with reference to the accompanying drawings. The dimensions and the scales of parts in the drawings are different from actual ones as appropriate and some parts are illustrated schematically to facilitate the understanding thereof. The scope of the present disclosure is not limited to the illustrated embodiments unless specified in the following descriptions to limit the present disclosure.

In the following explanations, an X-axis, a Y-axis, and a Z-axis orthogonal to each other are properly used for convenience sake. Hereinafter, one direction along the X-axis is an X1 direction and the direction opposite to the X1 direction is an X2 direction. One direction along the Y-axis is a Y1 direction and the direction opposite to the Y1 direction is a Y2 direction. One direction along the Z-axis is a Z1 direction and the direction opposite to the Z1 direction is a Z2 direction. A plane along the X-axis and the Y-axis is an X-Y plane. The Z1 direction is assumed as "upper direction," and the Z2 direction is assumed as "lower direction." "An element β on an element α" implies that the element β is located in the upper direction of the element α. As a result, "an element β on an element α" includes not only a case in which the element β is in direct contact with the element α but also a case in which the element α and the element β are away from each other. The "electrical connection" between an element α and an element β includes a configuration in which the element α and the element β are directly joined to be brought into conduction and also a configuration in which the element α and the element β are indirectly brought into conduction via a different conductor. A situation in which "an element α and an element β are equal" described in the present specification implies that the element α and the element β are substantially equal and includes a manufacturing error in a range not departing from actions and effects thereof, or the like.

First Embodiment

1. Semiconductor Module 1

1-1. Outline of Semiconductor Module 1

Figure 2:
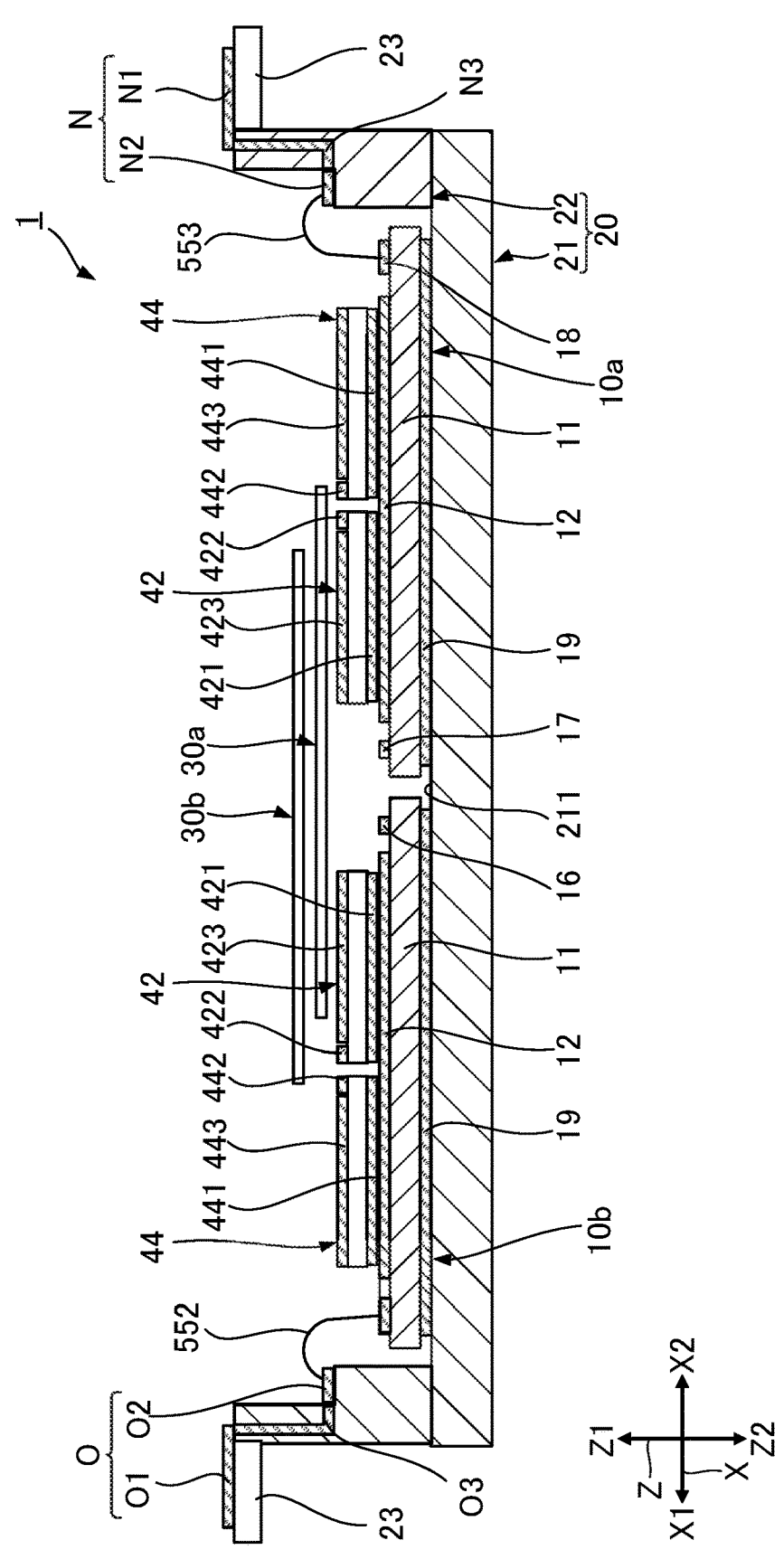
FIG. 2 is a sectional view of the semiconductor module 1 along line A-A in FIG. 1.
Figure 3:
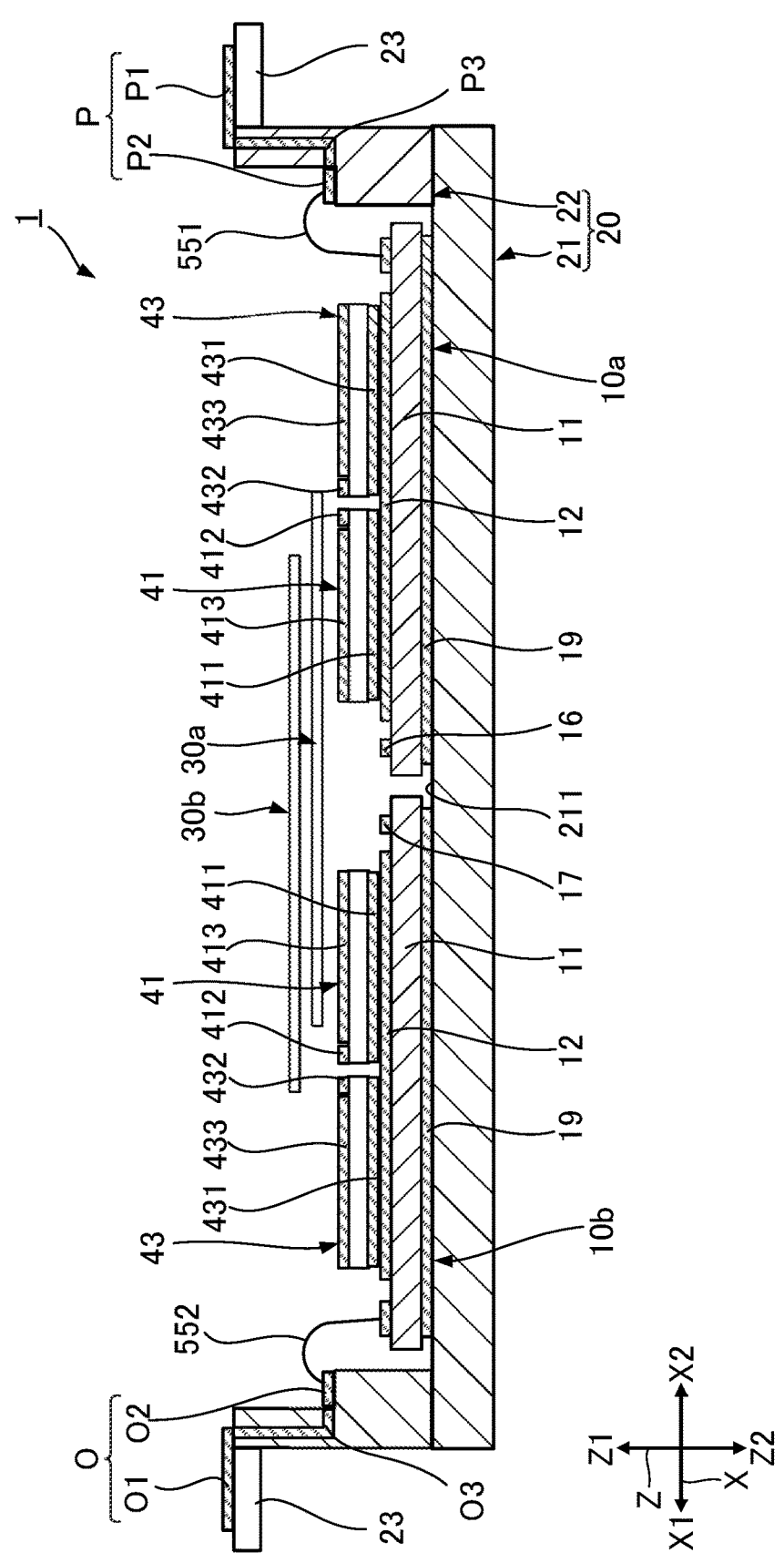
FIG. 3 is a sectional view of the semiconductor module 1 along line B-B in FIG. 1.

FIG. 1 is a plan view of a semiconductor module 1 according to the present embodiment. FIG. 2 is a sectional view of the semiconductor module 1 along line A-A in FIG. 1. FIG. 3 is a sectional view of the semiconductor module 1 along line B-B in FIG. 1. The semiconductor module 1 illustrated in FIGS. 1, 2, and 3 is used as, for example, a power convertor, such as a power module.

The semiconductor module 1 illustrated in FIGS. 1, 2, and 3 includes a case 20, a first unit 10a, a second unit 10b, a first connecting line 30a, and a second connecting line 30b. The first connecting line 30a corresponds to a "connecting line" for electrically connecting a power collecting portion of the first unit 10a to a conductive pattern of the second unit 10b. Although not illustrated, the first unit 10a, the second unit 10b, the first connecting line 30a, and the second connecting line 30b are molded by a resin, or the like.

As illustrated in FIGS. 1, 2, and 3, the case 20 includes a heat dissipating substrate 21 and a sidewall 22. The heat dissipating substrate 21 is a plate-like substrate functioning as a base of the first unit 10a and the second unit 10b. The heat dissipating substrate 21 has an upper surface 211 as a principal surface. Viewing from the normal direction of the upper surface 211 is referred to as a "plan view." The thickness direction of the heat dissipating substrate 21 is parallel to the directions along the Z-axis.

The heat dissipating substrate 21 is made of a material with high thermal conductivity. Examples of the material of the heat dissipating substrate 21 include metals such as copper and aluminum, and alloys thereof. The first unit 10a and the second unit 10b are arranged on the upper surface 211. The upper surface 211 may be plated with a metal such as nickel or an alloy thereof to improve corrosion resistance. Although the shape of the heat dissipating substrate 21 in plan view is rectangular with the directions along the X-axis as the longitudinal direction in the example illustrated in FIG. 1, this shape is an example and a desired shape can be properly applied thereto.

The sidewall 22 is joined to the upper surface 211. In the example illustrated in FIG. 1, the shape of the sidewall 22 in plan view is like a rectangular frame along the outer edge of the heat dissipating substrate 21. The sidewall 22 has the directions along the X-axis as the longitudinal direction. The shape of the sidewall 22 in plan view illustrated in FIG. 1 is an example, and a desired shape can be properly applied thereto according to the shape of the heat dissipating substrate 21. The sidewall 22 is formed of, for example, a resin and is joined to the heat dissipating substrate 21 with an adhesive.

A plurality of protruding pieces 23 protruding from the sidewall 22 toward the outer side of the sidewall 22 are arranged on the upper edge of the sidewall 22. The protruding pieces 23 are arranged on wall portions of the sidewall 22 facing in the longitudinal direction. Each of the protruding pieces 23 is a resin plate-like member made integrally with the sidewall 22. The sidewall 22 has a stepped surface 221 parallel to the X-Y plane in the middle of the inner wall surface. The shape of the stepped surface 221 in plan view is rectangular frame-like with the directions along the X-axis as the longitudinal direction.

Various terminals for inputting a current to or outputting a current from the first unit 10a and the second unit 10b are arranged on the sidewall 22. Specifically, a positive power-supply terminal P, a negative power-supply terminal N, and an output terminal O are arranged on the sidewall 22. The positive power-supply terminal P is connected to a positive terminal of a DC power source. The negative power-supply terminal N is connected to a negative terminal of the DC power source. The positive power-supply terminal P and the negative power-supply terminal N are arranged in the X2 direction relative to the first unit 10a and the second unit 10b. The output terminal O is arranged in the X1 direction relative to the first unit 10a and the second unit 10b.

The positive power-supply terminal P has a first terminal P1 and a second terminal P2. The first terminal P1 is arranged on one of the protruding pieces 23. The second terminal P2 is arranged on the stepped surface 221. The second terminal P2 is electrically connected to the first terminal P1 via a through electrode P3 penetrating through the sidewall 22. The negative power-supply terminal N has a first terminal N1 and a second terminal N2. The first terminal N1 is arranged on one of the protruding pieces 23. The second terminal N2 is arranged on the stepped surface 221. The second terminal N2 is electrically connected to the first terminal N1 via a through electrode N3 penetrating through the sidewall 22. The output terminal O has two first terminals O1 and two second terminals O2. Each of the first terminals O1 is arranged on one of the protruding pieces 23. The second terminals O2 are arranged on the stepped surface 221. The second terminals O2 are electrically connected to, respectively, the two first terminals O1 via through electrodes O3 penetrating through the sidewall 22.

Auxiliary emitter terminals E1 and E2 and control terminals G1 and G2 are arranged on parts of the stepped surface 221 along the X-axis. The auxiliary emitter terminal E1 and the control terminal G1 are arranged in the Y1 direction relative to the first unit 10a and the second unit 10b. The auxiliary emitter terminal E2 and the control terminal G2 are arranged in the Y2 direction relative to the first unit 10a and the second unit 10b.

The first unit 10a and the second unit 10b are housed in the case 20. The first unit 10a and the second unit 10b are arrayed in a line in the X1 direction. The number of the first unit 10a and the second unit 10b illustrated in FIGS. 1, 2, and 3 is an example, and a necessary number thereof can be installed.

As illustrated in FIGS. 2 and 3, a metallic plate 19 is joined to each of the lower surfaces of the first unit 10a and the second unit 10b. The metallic plates 19 are joined to the upper surface 211 of the heat dissipating substrate 21 with a joining material (not illustrated).

In the present embodiment, each of the first unit 10a and the second unit 10b includes an RC (Reverse Conducting)-IGBT (Insulated Gate Bipolar Transistor) integrally having the function of an IGBT and the function of an FWD (Free Wheeling Diode). The RC-IGBT reduces the area of each unit as compared to a case in which an IGBT and an FWD are separate units, so that higher-density packaging can be realized. As a result, the current rating can be increased.

Each of the first unit 10a and the second unit 10b may include a switching element other than an IGBT, such as a power MOSFET (Metal Oxide Semiconductor Field Effect Transistor) in which a body diode functions as an FWD similarly to a diode of an RC-IGBT where an IGBT and the diode are integrally formed.

The first connecting line 30a and the second connecting line 30b illustrated in FIGS. 1, 2, and 3 are arranged in the Z1 direction of the first unit 10a and the second unit 10b. Each of the first connecting line 30a and the second connecting line 30b is electrically connected to the first unit 10a and the second unit 10b. Each of the first connecting line 30a and the second connecting line 30b is separate from the first unit 10a and the second unit 10b except for connection parts with the first unit 10a and the second unit 10b. Each of the first connecting line 30a and the second connecting line 30b is constituted of, for example, a plate lead frame. However, each of the first connecting line 30a and the second connecting line 30b may be constituted of a flexible ribbon cable formed in a band shape.

1-2. Circuit Configuration

Figure 4:
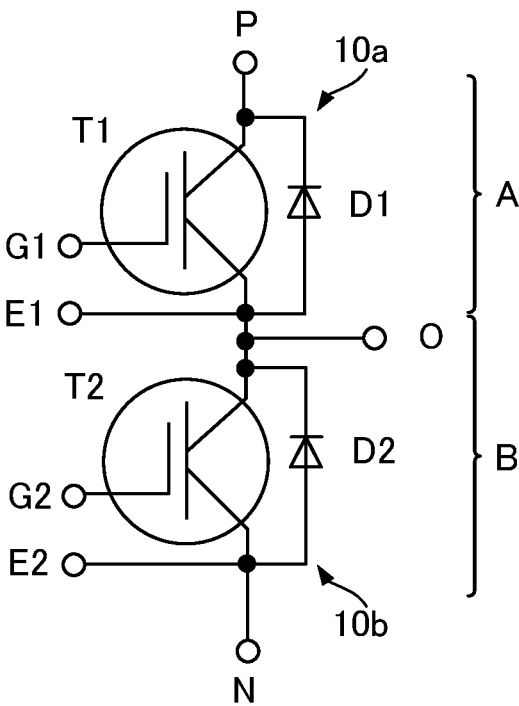
FIG. 4 is a configuration diagram of a circuit constituted of a first unit and a second unit illustrated in FIG. 1.

FIG. 4 is a configuration diagram of a circuit constituted of the first unit 10a and the second unit 10b illustrated in FIG. 1. As illustrated in FIG. 4, the first unit 10a constitutes an upper arm A of an inverter, and the second unit 10b constitutes a lower arm B of the inverter. The first unit 10a and the second unit 10b are connected in series.

The first unit 10a includes a transistor T1 and a diode D1. The second unit 10b includes a transistor T2 and a diode D2. In the present example, the transistor T1, and the diode D1 connected in antiparallel to the transistor T1 comprise an integrated RC-IGBT. The transistor T2, and the diode D2 connected in antiparallel to the transistor T2 comprise an integrated RC-IGBT.

Each of the transistors T1 and T2 has a collector, an emitter, and a gate. The collector of the transistor T1 is connected to the positive power-supply terminal P. The emitter of the transistor T2 is connected to the negative power-supply terminal N. The connection point between the emitter of the transistor T1 and the collector of the transistor T2 is connected to the AC output terminal O. The emitter of the transistor T1 is connected to the auxiliary emitter terminal E1. The emitter of the transistor T2 is connected to the auxiliary emitter terminal E2. The gate of the transistor T1 is connected to the control terminal G1. The gate of the transistor T2 is connected to the control terminal G2.

1-3. First Unit 10a and Second Unit 10b

Figure 5:
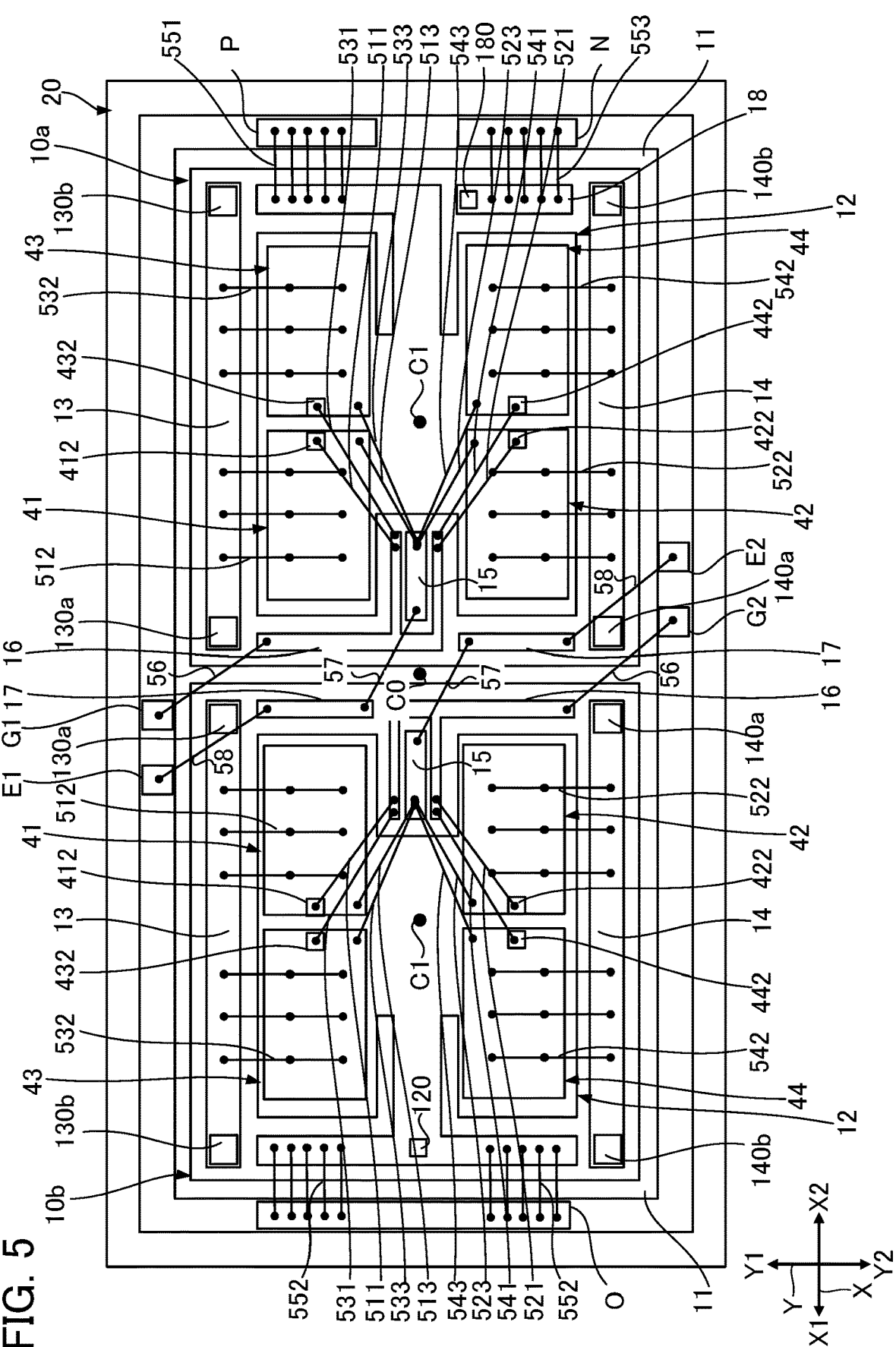
FIG. 5 is a plan view of the first unit and the second unit illustrated in FIG. 1.

FIG. 5 is a plan view of the first unit 10a and the second unit 10b illustrated in FIG. 1. As illustrated in FIG. 5, the first unit 10a and the second unit 10b are arranged across a center C0. The center C0 is the center of the semiconductor module 1 in plan view. The center C0 is also an intermediate point between the first unit 10a and the second unit 10b. The center C0 is also the center of the case 20 in plan view. The first unit 10a is arranged in the X2 direction relative to the center C0 and the second unit 10b is arranged in the X1 direction relative to the center C0. The first unit 10a and the second unit 10b have a substantially line-symmetric structure with respect to the center line of the semiconductor module 1 along the Y-axis.

As illustrated in FIG. 5, each of the first unit 10a and the second unit 10b has a conductive pattern 12, a first outputting conductive pattern 13, a second outputting conductive pattern 14, a controlling conductive pattern 16, a first auxiliary emitter conductive pattern 15, and a second auxiliary emitter conductive pattern 17 on the upper surface of an insulating substrate 11. Each of the first unit 10a and the second unit 10b further has a first semiconductor element 41, a second semiconductor element 42, a third semiconductor element 43, and a fourth semiconductor element 44. The first unit 10a also has a negative terminal conductive pattern 18.

The shape of the insulating substrate 11 of each of the first unit 10a and the second unit 10b in plan view is rectangular in the illustrated example. As illustrated in FIGS. 2 and 3, each of the insulating substrates 11 is placed on the associated metallic plate 19 described above. Each of the insulating substrates 11 has an insulating property. Ceramics such as aluminum oxide, and resins such as epoxy resin are cited as examples of the material of the insulating substrates 11.

A pattern on each of the units has a conductive property and is made of, for example, a metal such as copper or aluminum or an alloy thereof. These patterns are electrically separated from each other. The thicknesses of these patterns are, for example, not less than 0.1 mm and not more than 2.0 mm although not particularly limited thereto. The thickness of each of these patterns is uniform.

Figure 6:
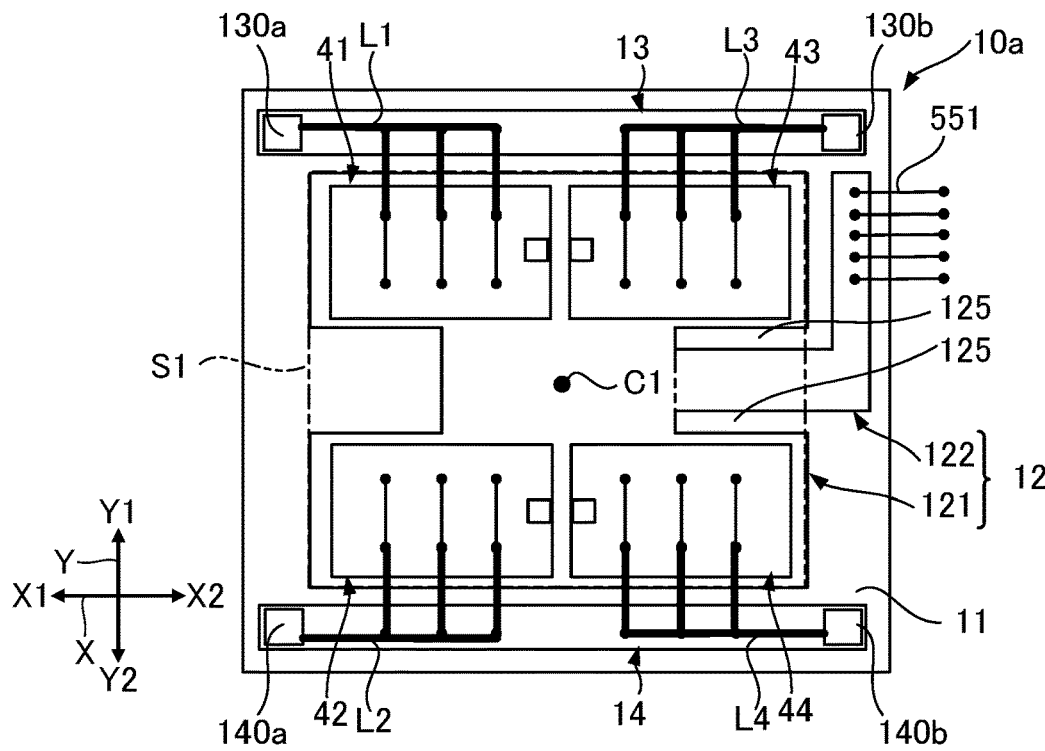
FIG. 6 is a plan view of a conductive pattern of the first unit illustrated in FIG. 5.

FIG. 6 is a plan view of the conductive pattern 12 of the first unit 10a illustrated in FIG. 5. As illustrated in FIG. 6, the conductive pattern 12 of the first unit 10a has an arrangement portion 121, and a first connection portion 122. The first semiconductor element 41, the second semiconductor element 42, the third semiconductor element 43, and the fourth semiconductor element 44 are arranged on the arrangement portion 121. Specifically, the first semiconductor element 41 is disposed at a first corner of a virtual rectangle S1 along the outer edge of the arrangement portion 121. The second semiconductor element 42 is disposed at a second corner of the virtual rectangle S1. The third semiconductor element 43 is disposed at a third corner of the virtual rectangle S1. The fourth semiconductor element 44 is disposed at a fourth corner of the virtual rectangle S1. The arrangement portion 121 is positioned at the center of the insulating substrate 11 in plan view. The arrangement portion 121 is arranged between the first outputting conductive pattern 13 and the second outputting conductive pattern 14. The first connection portion 122 extends in the X2 direction from a vicinity of the center of the arrangement portion 121 and subsequently extends in the Y1 direction. As illustrated in FIG. 5, the first connection portion 122 is electrically connected to the positive power-supply terminal P with a plurality of wires 551.

As illustrated in FIG. 6, the conductive pattern 12 of the first unit 10a has an input portion C1. The input portion C1 is the center of the arrangement portion 121 in plan view. The input portion C1 is electrically connected to the positive power-supply terminal P via the wires 551 and the first connection portion 122. The conductive pattern 12 of the first unit 10a has two slits 125. As a result, the first connection portion 122 has a part extending in the X2 direction away from the arrangement portion 121.

Figure 7:
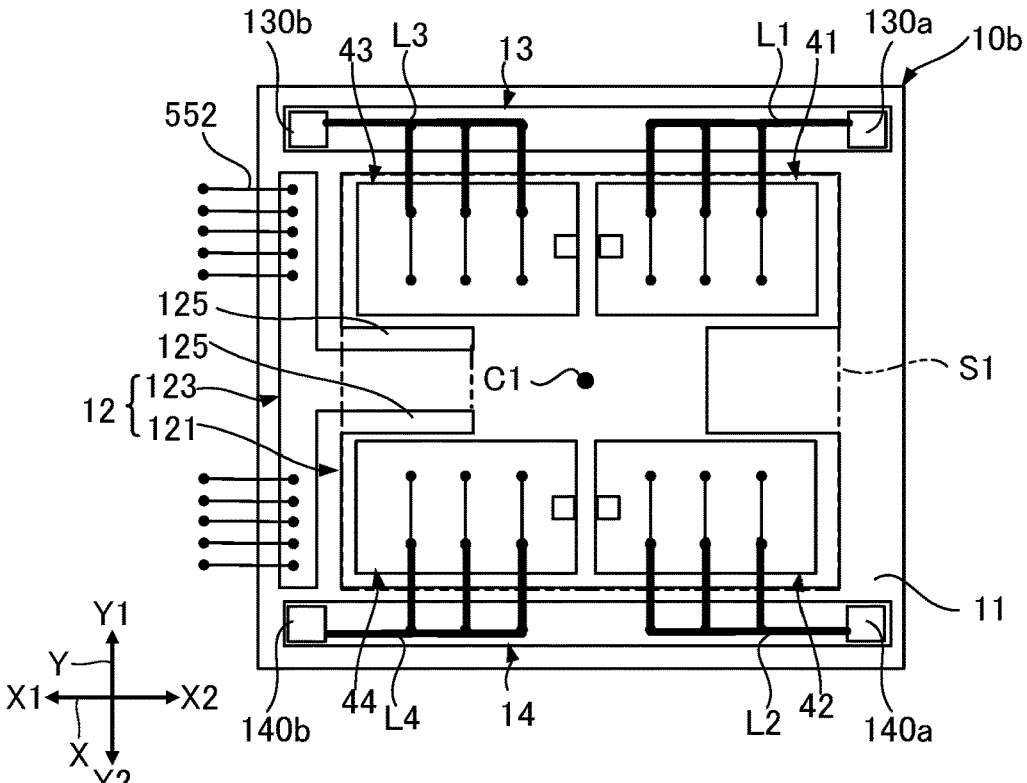
FIG. 7 is a plan view of a conductive pattern of the second unit illustrated in FIG. 5.

FIG. 7 is a plan view of the conductive pattern 12 of the second unit illustrated in FIG. 5. As illustrated in FIG. 7, the conductive pattern 12 of the second unit 10b has an arrangement portion 121 and a second connection portion 123. The first semiconductor element 41, the second semiconductor element 42, the third semiconductor element 43, and the fourth semiconductor element 44 are arranged on the arrangement portion 121. Specifically, the first semiconductor element 41 is disposed at a first corner of a virtual rectangle S1 along the outer edge of the arrangement portion 121. The second semiconductor element 42 is disposed at a second corner of the virtual rectangle S1. The third semiconductor element 43 is disposed at a third corner of the virtual rectangle S1. The fourth semiconductor element 44 is disposed at a fourth corner of the virtual rectangle S1. The arrangement portion 121 is positioned at the center of the insulating substrate 11 in plan view. The arrangement portion 121 is arranged between the first outputting conductive pattern 13 and the second outputting conductive pattern 14. The second connection portion 123 extends in the X1 direction from a vicinity of the center of the arrangement portion 121 and subsequently extends both in the Y1 direction and the Y2 direction. As illustrated in FIG. 5, the second connection portion 123 is electrically connected to the output terminal O with a plurality of wires 552.

As illustrated in FIG. 7, the conductive pattern 12 of the second unit has an input portion C1. The input portion C1 is the center of the arrangement portion 121 in plan view. The input portion C1 is electrically connected to the output terminal O via the wires 552 and the second connection portion 123. The conductive pattern 12 of the second unit 10b has two slits 125. Thus, the second connection portion 123 has a part extending in the X1 direction away from the arrangement portion 121. A terminal join portion 120 for connecting the conductive pattern 12 to the first connecting line 30a illustrated in FIG. 1 is provided on the conductive pattern 12 of the second unit 10b.

As illustrated in FIGS. 6 and 7, the conductive patterns 12 are arranged between the first outputting conductive pattern 13 and the second outputting conductive pattern 14 in plan view. The first outputting conductive pattern 13 is arranged in the Y1 direction relative to the conductive pattern 12. The second outputting conductive pattern 14 is arranged in the Y2 direction relative to the conductive pattern 12. Each of the first outputting conductive pattern 13 and the second outputting conductive pattern 14 is an elongated pattern along the X-axis.

As illustrated in FIG. 5, two first power collecting portions 130a and 130b are arranged in the longitudinal direction, one of which is at one end of the first outputting conductive patterns 13, and the other of which is at the other end of the first outputting conductive patterns 13. Two second power collecting portions 140a and 140b shown in FIG. 5 are arranged in the longitudinal direction, one of which is at one end of the second outputting conductive patterns 14, the other of which is at the other end of the second outputting conductive patterns 14. The following are connected to the first connecting line 30a illustrated in FIG. 1: (i) the first power collecting portions 130a and 130b of the first unit 10a, and (ii) the second power collecting portions 140a and 140b of the first unit 10a. The following are connected to the second connecting line 30b illustrated in FIG. 1: (i) the first power collecting portions 130a and 130b of the second unit 10b, and (ii) the second power collecting portions 140a and 140b of the second unit 10b.

The conductive pattern 12 is disposed between the two first power collecting portions 130a and 130b and the two second power collecting portions 140a and 140b in plan view. The two first power collecting portions 130a and 130b are arranged in the Y1 direction relative to the conductive pattern 12. The two second power collecting portions 140a and 140b are arranged in the Y2 direction relative to the conductive pattern 12.

The first power collecting portion 130a is provided at a location near the first semiconductor element 41. Current from the first semiconductor element 41 is mainly collected to the first power collecting portion 130a. The first power collecting portion 130b is provided at a location near the third semiconductor element 43. Current from the third semiconductor element 43 is mainly collected to the first power collecting portion 130b. The second power collecting portion 140a is provided at a location near the second semiconductor element 42. Current from the second semiconductor element 42 is mainly collected to the second power collecting portion 140a. The second power collecting portion 140b is provided at a location near the fourth semiconductor element 44. Current from the fourth semiconductor element 44 is mainly collected to the second power collecting portion 140b.

As illustrated in FIG. 5, the first auxiliary emitter conductive pattern 15, the controlling conductive pattern 16, and the second auxiliary emitter conductive pattern 17 are closer to the center C0 than the conductive pattern 12 is in each of the units. The first auxiliary emitter conductive pattern 15, the controlling conductive pattern 16, and the second auxiliary emitter conductive pattern 17 of the first unit 10a are arranged in the X1 direction relative to the conductive pattern 12 of the first unit 10a. The first auxiliary emitter conductive pattern 15, the controlling conductive pattern 16, and the second auxiliary emitter conductive pattern 17 of the second unit 10b are arranged in the X2 direction relative to the conductive pattern 12 of the second unit 10b.

The first auxiliary emitter conductive pattern 15 is an elongated pattern along the X-axis. The first auxiliary emitter conductive pattern 15 is arranged on the central line of the semiconductor module 1 along the X-axis.

The controlling conductive pattern 16 is F-shaped in plan view. The controlling conductive pattern 16 has an elongated part extending along the Y-axis, and two elongated parts extending from this part along the X-axis. These two elongated parts are arranged to sandwich the first auxiliary emitter conductive pattern 15 therebetween. The controlling conductive pattern 16 of the first unit 10a is electrically connected to the control terminal G1 with a wire 56. The controlling conductive pattern 16 of the second unit 10b is electrically connected to the control terminal G2 with a wire 56.

The second auxiliary emitter conductive pattern 17 is an elongated pattern along the Y-axis. The second auxiliary emitter conductive pattern 17 of the first unit 10a is arranged in the Y2 direction relative to the controlling conductive pattern 16 of the first unit 10a. The second auxiliary emitter conductive pattern 17 of the second unit 10b is arranged in the Y1 direction relative to the controlling conductive pattern 16 of the second unit 10b.

The second auxiliary emitter conductive pattern 17 of the first unit 10a is electrically connected to the first auxiliary emitter conductive pattern 15 of the second unit 10b with a wire 57. The second auxiliary emitter conductive pattern 17 of the second unit 10b is electrically connected to the first auxiliary emitter conductive pattern 15 of the first unit 10a with a wire 57.

The second auxiliary emitter conductive pattern 17 of the first unit 10a is electrically connected to the auxiliary emitter terminal E2 with a wire 58. The second auxiliary emitter conductive pattern 17 of the second unit 10b is electrically connected to the auxiliary emitter terminal E1 with a wire 58.

The negative terminal conductive pattern 18 of the first unit 10a is arranged in the X2 direction relative to the conductive pattern 12. The negative terminal conductive pattern 18 is electrically connected to the negative power-supply terminal N with a plurality of wires 553. A terminal join portion 180 for connecting the negative terminal conductive pattern 18 to the second connecting line 30b illustrated in FIG. 1 is provided on the negative terminal conductive pattern 18.

The first semiconductor element 41, the second semiconductor element 42, the third semiconductor element 43, and the fourth semiconductor element 44 are electrically connected to the conductive pattern 12. The first semiconductor element 41, the second semiconductor element 42, the third semiconductor element 43, and the fourth semiconductor element 44 are dispersedly arranged in each unit. Specifically, the semiconductor elements are arranged dispersed in such a manner that the distances from the input portion C1 to the semiconductor elements are equalized.

The first semiconductor element 41 and the third semiconductor element 43 are arranged in the Y1 direction relative to the center line of the semiconductor module 1 along the X-axis. The second semiconductor element 42 and the fourth semiconductor element 44 are arranged in the Y2 direction relative to the center line of the semiconductor module 1 along the X-axis. The first semiconductor element 41 is closer to the center C0 than the third semiconductor element 43 is. The second semiconductor element 42 is closer to the center C0 than the fourth semiconductor element 44 is.

Each of the first semiconductor element 41, the second semiconductor element 42, the third semiconductor element 43, and the fourth semiconductor element 44 includes, for example, an RC-IGBT. One transistor T1 of the upper arm A in FIG. 4 is constituted of IGBTs of the four first to fourth semiconductor elements 41 to 44 connected in parallel to each other, and one diode D1 of the upper arm A in FIG. 4 is constituted of FWDs thereof connected in parallel to each other.

As illustrated in FIG. 3, the first semiconductor element 41 has a collector electrode 411 being a "first input electrode," a gate electrode 412 being a "first control electrode," and an emitter electrode 413 being a "first output electrode." The collector electrode 411 is an electrode formed on the lower surface of a semiconductor layer and is joined to the conductive pattern 12 with, for example, solder or a sintered material. The lower surface is a surface of the first semiconductor element 41 facing the conductive pattern 12. Each of the gate electrode 412 and the emitter electrode 413 is an electrode formed on the upper surface of the semiconductor layer. It is preferable that the gate electrode 412 be closer to the third semiconductor element 43 than the emitter electrode 413 is. As illustrated in FIG. 5, the gate electrode 412 is electrically connected to the controlling conductive pattern 16 with a wire 511 being a "controlling line." The emitter electrode 413 is electrically connected to the first outputting conductive pattern 13 with a wire 512 being a "first line." The emitter electrode 413 is not shown in FIG. 5. The emitter electrode 413 is electrically connected to the first auxiliary emitter conductive pattern 15 with a wire 513.

As illustrated in FIG. 2, the second semiconductor element 42 has a collector electrode 421 being a "second input electrode," a gate electrode 422 being a "second control electrode," and an emitter electrode 423 being a "second output electrode." The collector electrode 421 is an electrode formed on the lower surface of a semiconductor layer and is connected to the conductive pattern 12 with, for example, solder or a sintered material. The lower surface is a surface of the second semiconductor element 42 facing the conductive pattern 12. Each of the gate electrode 422 and the emitter electrode 423 is an electrode formed on the upper surface of the semiconductor layer. It is preferable that the gate electrode 422 be closer to the fourth semiconductor element 44 than the emitter electrode 423 is. As illustrated in FIG. 5, the gate electrode 422 is electrically connected to the controlling conductive pattern 16 with a wire 521 being a "controlling line." The emitter electrode 423 is electrically connected to the second outputting conductive pattern 14 with a wire 522 being a "second line." The emitter electrode 423 is not shown in FIG. 5. The emitter electrode 423 is electrically connected to the first auxiliary emitter conductive pattern 15 with a wire 523.

As illustrated in FIG. 3, the third semiconductor element 43 has a collector electrode 431 being a "third input electrode," a gate electrode 432 being a "third control electrode," and an emitter electrode 433 being a "third output electrode." The collector electrode 431 is an electrode formed on the lower surface of a semiconductor layer and is connected to the conductive pattern 12 with, for example, solder or a sintered material. The lower surface is a surface of the third semiconductor element 43 facing the conductive pattern 12. Each of the gate electrode 432 and the emitter electrode 433 is an electrode formed on the upper surface of the semiconductor layer. It is preferable that the gate electrode 432 is closer to the first semiconductor element 41 than the emitter electrode 433 is. As illustrated in FIG. 5, the gate electrode 432 is electrically connected to the controlling conductive pattern 16 with a wire 531 being a "controlling line." The emitter electrode 433 is electrically connected to the first outputting conductive pattern 13 with a wire 532 being a "third line." The emitter electrode 433 is not shown in FIG. 5. The emitter electrode 433 is electrically connected to the first auxiliary emitter conductive pattern 15 with a wire 533.

As illustrated in FIG. 2, the fourth semiconductor element 44 has a collector electrode 441 being a "fourth input electrode," a gate electrode 442 being a "fourth control electrode," and an emitter electrode 443 being a "fourth output electrode." The collector electrode 441 is an electrode formed on the lower surface of a semiconductor layer and is connected to the conductive pattern 12 with, for example, solder or a sintered material. The lower surface is a surface of the fourth semiconductor element 44 facing the conductive pattern 12. Each of the gate electrode 442 and the emitter electrode 443 is an electrode formed on the upper surface of the semiconductor layer. It is preferable that the gate electrode 442 be closer to the second semiconductor element 42 than the emitter electrode 443 is. As illustrated in FIG. 5, the gate electrode 442 is electrically connected to the controlling conductive pattern 16 with a wire 541 being a "controlling line." The emitter electrode 443 is electrically connected to the second outputting conductive pattern 14 with a wire 542 being a "fourth line." The emitter electrode 443 is not shown in FIG. 5. The emitter electrode 443 is electrically connected to the first auxiliary emitter conductive pattern 15 with a wire 543.

Each of the various wires in the explanations described above may be replaced with a ribbon cable or a lead frame.

Figure 8:
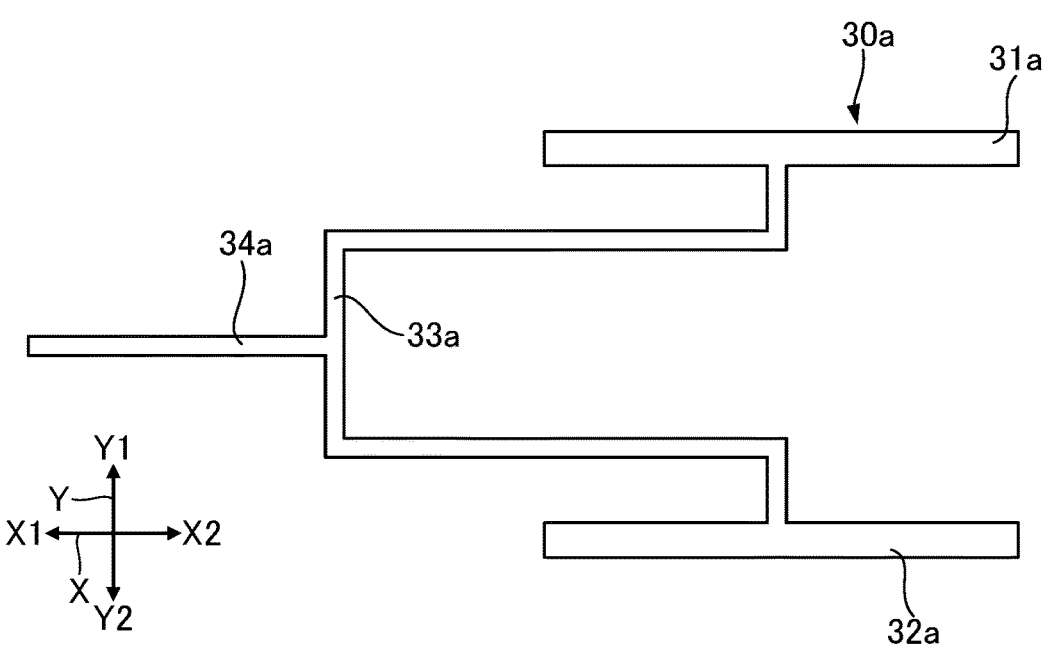
FIG. 8 is a plan view of a first connecting line illustrated in FIG. 1.

FIG. 8 is a plan view of the first connecting line 30a illustrated in FIG. 1. As illustrated in FIG. 8, the first connecting line 30a has a first part 31a, a second part 32a, a third part 33a, and a fourth part 34a. The first part 31a and the second part 32a extend along the X-axis. The third part 33a connects the first part 31a and the second part 32a to each other. The fourth part 34a extends in the X1 direction from the third part 33a.

The first part 31a extends along the first outputting conductive pattern 13 of the first unit 10a illustrated in FIG. 5. The first part 31a overlaps with the first outputting conductive pattern 13 in plan view. The second part 32a illustrated in FIG. 8 extends along the second outputting conductive pattern 14 of the first unit 10a illustrated in FIG. 5. The second part 32a overlaps with the second outputting conductive pattern 14 in plan view. Although not illustrated, the first part 31a and the second part 32a have parts extending in the Z2 direction from the both ends thereof, respectively, and the tips thereof are joined to the first power collecting portions 130a and 130b of the first outputting conductive pattern 13 and the second power collecting portions 140a and 140b of the second outputting conductive pattern 14, respectively. The third part 33a illustrated in FIG. 8 extends along the Y-axis from the first part 31a and the second part 32a, extends in the X1 direction, and subsequently extends along the Y-axis to join together. The fourth part 34a is connected to this join part. An end of the fourth part 34a opposite to the third part 33a is electrically connected to the terminal join portion 120 illustrated in FIG. 5 via a part extending in the Z2 direction (not illustrated).

Figure 9:
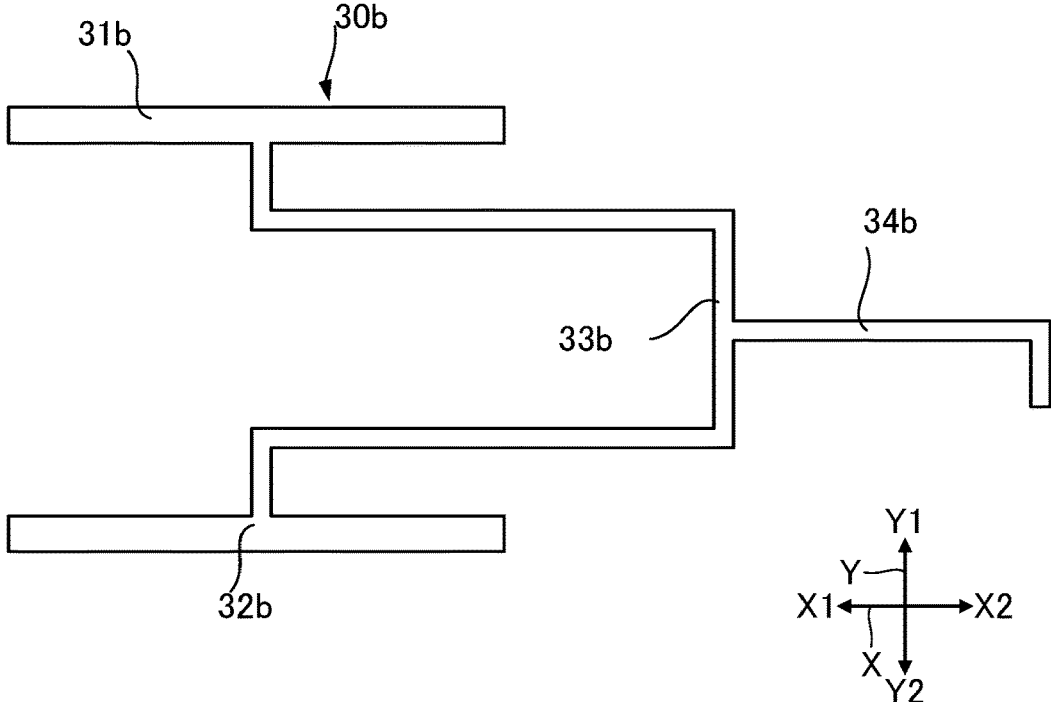
FIG. 9 is a plan view of a second connecting line illustrated in FIG. 1.

FIG. 9 is a plan view of the second connecting line 30b illustrated in FIG. 1. As illustrated in FIG. 9, the second connecting line 30b has a first part 31b, a second part 32b, a third part 33b, and a fourth part 34b. The first part 31b and the second part 32b extend along the X-axis. The third part 33b connects the first part 31b and the second part 32b to each other. The fourth part 34b has a part extending in the X2 direction from the third part 33b.

The first part 31b extends along the first outputting conductive pattern 13 of the second unit 10b illustrated in FIG. 5. The first part 31b overlaps with the first outputting conductive pattern 13 in plan view. The second part 32b illustrated in FIG. 9 extends along the second outputting conductive pattern 14 of the second unit 10b illustrated in FIG. 5. The second part 32b overlaps with the second outputting conductive pattern 14 in plan view. Although not illustrated, the first part 31b and the second part 32b have parts extending in the Z2 direction from the both ends thereof, respectively, and the tips thereof are joined to the first power collecting portions 130a and 130b of the first outputting conductive pattern 13 and the second power collecting portions 140a and 140b of the second outputting conductive pattern 14, respectively. The third part 33b illustrated in FIG. 9 extends along the Y-axis from the first part 31b and the second part 32b, extends in the X2 direction, and subsequently extends along the Y-axis to join together. The fourth part 34b is connected to this join part. The fourth part 34b extends in the X2 direction from the third part 33b and subsequently extends in the Y2 direction. An end of the fourth part 34b opposite to the third part 33b is electrically connected to the terminal join portion 180 illustrated in FIG. 5 via a part extending in the Z2 direction (not illustrated).

Figure 10:
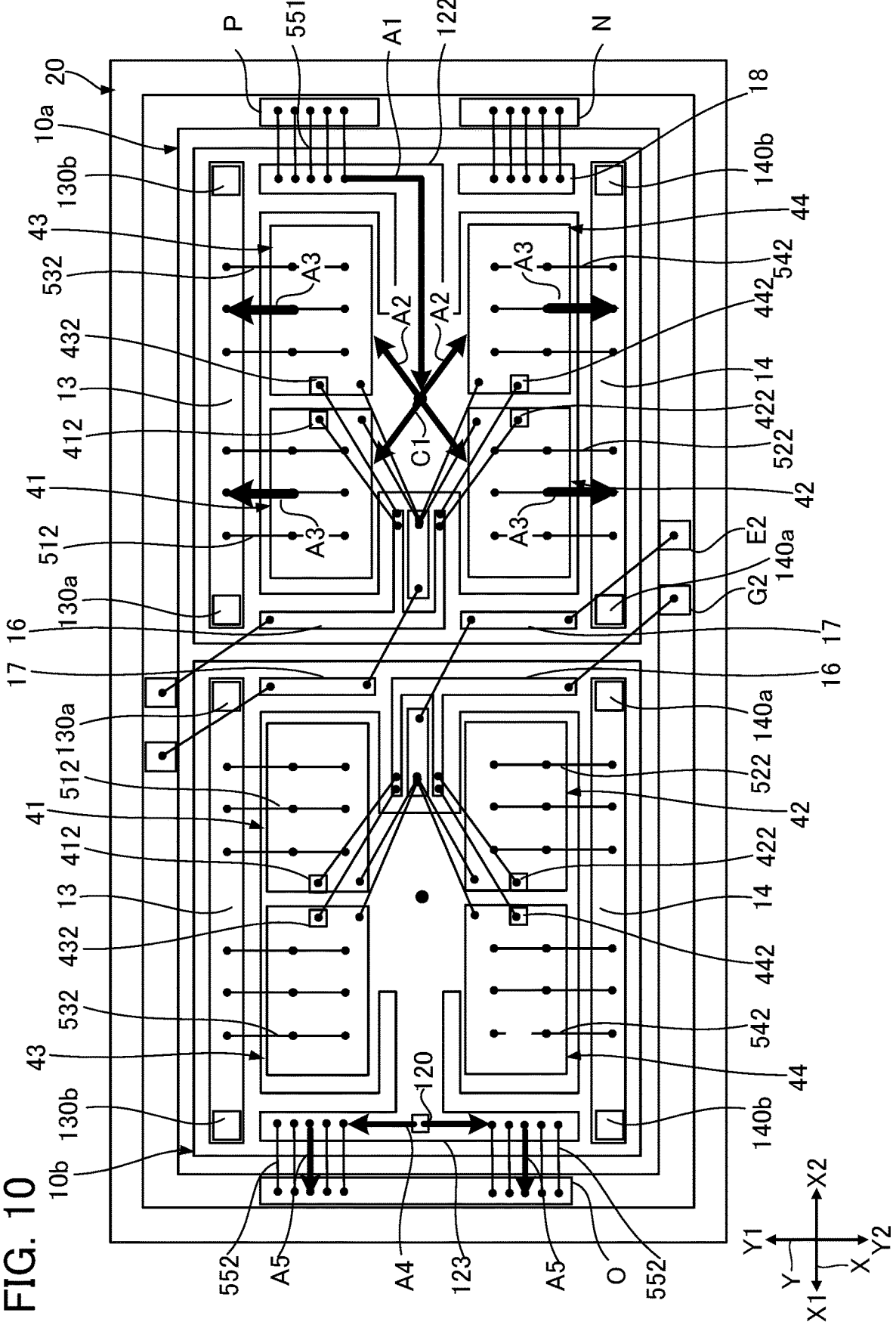
FIG. 10 is a diagram for explaining a flow of current in an upper arm.
Figure 11:
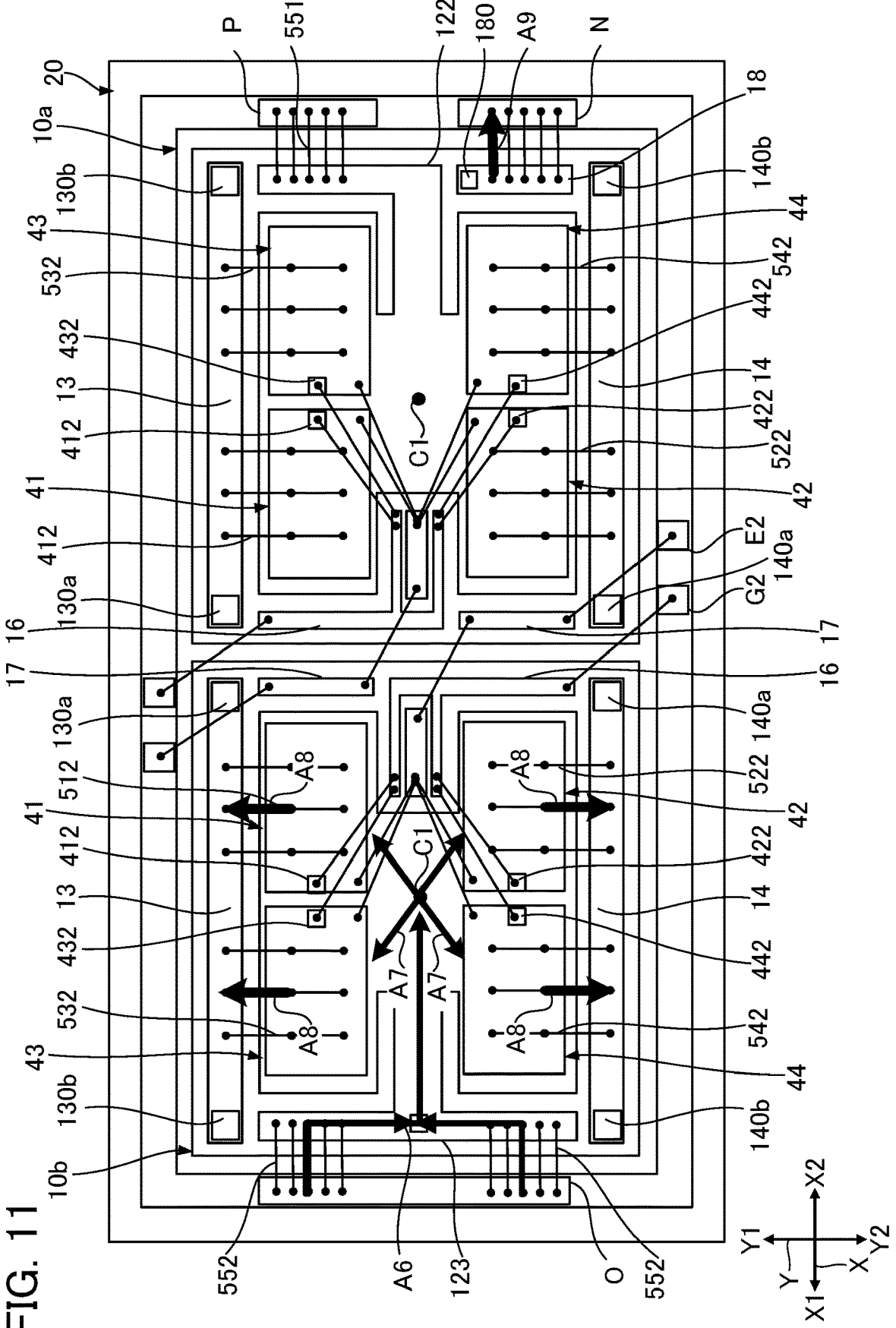
FIG. 11 is a diagram for explaining a flow of current in a lower arm.

FIG. 10 is a diagram for explaining a flow of current in the upper arm. FIG. 11 is a diagram for explaining a flow of current in the lower arm. A current path of the main circuit, that is, the main current path is explained with reference to FIGS. 10 and 11.

When a current flows from the positive power-supply terminal P to the output terminal O, the current flows as indicated by arrows A1, A2, and A3 in FIG. 10 in this order, and the current subsequently passes through the first connecting line 30a illustrated in FIGS. 1 and 8 to flow as indicated by arrows A4 and A5 in FIG. 10 in this order.

Specifically, the current flows in the order as follows:
The positive power-supply terminal P→the wires 551→the first connection portion 122→the input portion C1→the first semiconductor element 41, the second semiconductor element 42, the third semiconductor element 43, and the fourth semiconductor element 44→the wires 512, 522, 532, and 542→the first outputting conductive pattern 13 and the second outputting conductive pattern 14→the first power collecting portions 130a and 130b, and the second power collecting portions 140a and 140b.

The current subsequently flows in the order as follows:
The first connecting line 30a illustrated in FIGS. 1 and 8→the terminal join portion 120 illustrated in FIG. 10→the wires 552→the output terminal O illustrated in FIG. 1.

When the current flows from the positive power-supply terminal P to the output terminal O, the positive power-supply terminal P functions as an "input terminal."

When a current flows from the output terminal O to the negative power-supply terminal N, the current flows as indicated by arrows A6, A7, and A8 in FIG. 11 in this order, and the current subsequently passes through the second connecting line 30b illustrated in FIGS. 1 and 9 to flow in a direction indicated by an arrow A9 in FIG. 11.

Specifically, the current flows in the order as follows:
The output terminal O→the wires 552→the second connection portion 123→the input portion C1→the first semiconductor element 41, the second semiconductor element 42, the third semiconductor element 43, and the fourth semiconductor element 44→the wires 512, 522, 532, and 542→the first outputting conductive pattern 13 and the second outputting conductive pattern 14→the first power collecting portions 130a and 130b, and the second power collecting portions 140a and 140b.

The current subsequently flows in the order as follows:
The second connecting line 30b illustrated in FIG. 1→the terminal join portion 180 illustrated in FIG. 11→the wires 553→the negative power-supply terminal N.

When the current flows from the output terminal O to the negative power-supply terminal N, the output terminal O functions as an "input terminal."

The conductive pattern 12 is disposed between the first power collecting portion 130a and the second power collecting portion 140a. Similarly, the conductive pattern 12 is disposed between the first power collecting portion 130b and the second power collecting portion 140b.

The current path length from the emitter electrode 413 to the first outputting conductive pattern 13, the current path length from the emitter electrode 423 to the second outputting conductive pattern 14, the current path length from the emitter electrode 433 to the first outputting conductive pattern 13, and the current path length from the emitter electrode 443 to the second outputting conductive pattern 14 are equal to each other.

As illustrated in FIGS. 5 and 6, the following current path lengths are equal to each other: (i) a current path length L1 from the emitter electrode 413 to the first power collecting portion 130a, (ii) a current path length L2 from the emitter electrode 423 to the second power collecting portion 140a, (iii) a current path length L3 from the emitter electrode 433 to the first power collecting portion 130b, and (iv) a current path length L4 from the emitter electrode 443 to the second power collecting portion 140b. Accordingly, the internal resistances and the inductances from the first semiconductor element 41 to the first power collecting portion 130a, from the second semiconductor element 42 to the second power collecting portion 140a, from the third semiconductor element 43 to the first power collecting portion 130b, and from the fourth semiconductor element 44 to the second power collecting portion 140b can be uniformed. As a result, current imbalance among the first semiconductor element 41, the second semiconductor element 42, the third semiconductor element 43, and the fourth semiconductor element 44 can be suppressed. This enables the temperature of the semiconductor module 1 to be decreased. The current path length L1 is a path of current from the first semiconductor element 41 to the first power collecting portion 130a. The same holds for other current path lengths L2 to L4.

By making the inductances in outputs from the semiconductor elements uniform on the main current path as described above, current sharing among the semiconductor elements can be equalized. As a result, increase in the temperature of any of the semiconductor elements to be higher than those of other semiconductor elements can be suppressed. This enables the reliability of the semiconductor module 1 to be enhanced.

In the first unit 10a, the current path lengths from the first power collecting portions 130a and 130b to the output terminal O through the first connecting line 30a and the current path lengths from the second power collecting portions 140a and 140b to the output terminal O through the first connecting line 30a are equal. Similarly, in the second unit 10b, the current path lengths from the first power collecting portions 130a and 130b to the negative power-supply terminal N through the second connecting line 30b and the current path lengths from the second power collecting portions 140a and 140b to the negative power-supply terminal N through the second connecting line 30b are equal.

In the first unit 10a, the following current path lengths are equal to each other: (i) the current path length from the emitter electrode 413 to the output terminal O, (ii) the current path length from the emitter electrode 423 to the output terminal O, (iii) the current path length from the emitter electrode 433 to the output terminal O, and (iv) the current path length from the emitter electrode 443 to the output terminal O. In the second unit 10b, the following current path lengths are equal to each other: (i) the current path length from the emitter electrode 413 to the negative power-supply terminal N, (ii) the current path length from the emitter electrode 423 to the negative power-supply terminal N, (iii) the current path length from the emitter electrode 433 to the negative power-supply terminal N, and (iv) the current path length from the emitter electrode 443 to the negative power-supply terminal N.

Thus, the inductances are made uniform also on the current paths from the semiconductor elements to the output terminal and to the negative power-supply terminal, so that current sharing among the semiconductor elements is equalized and the reliability of the semiconductor module 1 can be enhanced.

As described above, the conductive pattern 12 is disposed between the first and second power collecting portions 130a and 140a. Similarly, the conductive pattern 12 is disposed between the first and second power collecting portions 130b and 140b. That is, the first power collecting portions 130a and 130b and the second power collecting portions 140a and 140b are provided on the outer side of the conductive pattern 12. Therefore, concentration of the wires 512, 522, 532, and 542 near the center of the conductive pattern 12 can be avoided. Accordingly, heat interference among the wires can be suppressed. Decrease in the arrangement efficiency of the various wires and the various terminals due to concentration of the wires near the center of the conductive pattern 12 can also be suppressed.

The semiconductor module 1 has four semiconductor elements including the first semiconductor element 41, the second semiconductor element 42, the third semiconductor element 43, and the fourth semiconductor element 44 in each of the units. As a result, the semiconductor module 1 according to this embodiment can deal with a larger current than in a case in which the semiconductor module 1 has two semiconductor elements.

As described above, the first semiconductor element 41, the second semiconductor element 42, the third semiconductor element 43, and the fourth semiconductor element 44 are dispersedly arranged. Specifically, the first semiconductor element 41 is provided at a first corner of a virtual rectangle along the outer edge of the arrangement portion 121 of the conductive pattern 12. The second semiconductor element 42 is provided at a second corner of the virtual rectangle. The third semiconductor element 43 is provided at a third corner of the virtual rectangle. The fourth semiconductor element 44 is provided at a fourth corner of the virtual rectangle. As a result, the four semiconductor elements can be distanced from each other. In the semiconductor module 1, the semiconductor elements are heat sources. Accordingly, the spaces between the four heat sources can be increased by distancing the four semiconductor elements from each other. The provision of each of the first to fourth semiconductor elements 41 to 44 at the corresponding corner of the conductive pattern 12 can suppress heat interference among the semiconductor elements.

When the function of a transistor and the function of a diode are integrated in each of the first to fourth semiconductor elements 41 to 44 as in the present embodiment, it is effective for each semiconductor element to be disposed at a corresponding corner. For example, in a comparative example in which a transistor and a diode are separate units, increase in the temperature of the semiconductor module 1 can be suppressed by arranging transistors and diodes in a staggered manner. In contrast thereto, in a case in which a transistor and a diode are included in one semiconductor element as in the present embodiment, the temperature of each of the semiconductor element is likely to increase. Therefore, in a configuration in which a transistor and a diode are included in one semiconductor element as in the present embodiment, it is preferable that a plurality of semiconductor elements be dispersedly arranged. Additionally, by making the inductances in outputs from the semiconductor elements uniform on the main current path as described above, the temperature of the semiconductor module 1 can be decreased. Specifically, the temperature of the semiconductor module 1 can be decreased to the same level as that in the case in which a transistor and a diode are separate units.

As described above, the conductive pattern 12 has the input portion C1 electrically connected to the output terminal O. The collector electrodes 411, 421, 431, and 441 are electrically connected to the input portion C1 because they are joined to the conductive pattern 12. The input portion C1 is closer to the center of the conductive pattern 12 in plan view than the collector electrodes 411, 421, 431, and 441 are. In addition, the following current path lengths are equal to each other: (i) the current path length from the input portion C1 to the collector electrode 411, (ii) the current path length from the input portion C1 to the collector electrode 421, (iii) the current path length from the input portion C1 to the collector electrode 431, and (iv) the current path length from the input portion C1 to the collector electrode 441. This enables the internal resistances and the inductances from the input portion C1 to the semiconductor elements to be uniformed. As a result, current imbalance among the first semiconductor element 41, the second semiconductor element 42, the third semiconductor element 43, and the fourth semiconductor element 44 can be suppressed. The temperature of the semiconductor module 1 can be decreased.

Thus, current sharing among a plurality of semiconductor elements can be equalized by making the inductances in inputs to the semiconductor elements uniform on the main current path. Accordingly, increase in the temperature of any of the semiconductor elements to be higher than those of other semiconductor elements can be suppressed. The reliability of the semiconductor module 1 can be enhanced. In particular, by making uniform the inductances in inputs to the semiconductor elements in addition to the inductances in outputs from the semiconductor elements, equalizing of current sharing among the semiconductor elements can be realized particularly effectively.

The semiconductor elements are provided between the first and second outputting conductive patterns 13 and 14. In contrast, the input portion C1 is closer to the center of the conductive pattern 12 than the semiconductor elements are. As a result, the input paths of the current to the semiconductor elements can be isolated from the output paths of the current from the semiconductor elements. This can suppress heat interference of the various wires. Accordingly, the temperature of the semiconductor module 1 can be decreased.

As described above, the two slits 125 are provided on the conductive pattern 12. In the first unit 10a, the two slits 125 extend along a direction from the positive power-supply terminal P functioning as the "input terminal" to the input portion C1. In the second unit 10b, the two slits 125 extend along a direction from the output terminal O functioning as the "input terminal" to the input portion C1.

In the first unit 10a, due to provision of the two slits 125, the current flows from the positive power-supply terminal P to each of the semiconductor elements through the first connection portion 122 and the input portion C1. These two slits 125 are provided to cause the current path length from the positive power-supply terminal P to the collector electrode 411 through the input portion C1, the current path length from the positive power-supply terminal P to the collector electrode 421 through the input portion C1, the current path length from the positive power-supply terminal P to the collector electrode 431 through the input portion C1, and the current path length from the positive power-supply terminal P to the collector electrode 441 through the input portion C1 to be equal to each other. As a result, the internal resistances and the inductances from the positive power-supply terminal P to the semiconductor elements can be made uniformed.

In the second unit 10b, due to provision of the two slits 125, the current flows from the output terminal O to each of the semiconductor elements through the second connection portion 123 and the input portion C1. These two slits 125 are provided to cause the current path length from the output terminal O to the collector electrode 411 through the input portion C1, the current path length from the output terminal O to the collector electrode 421 through the input portion C1, the current path length from the output terminal O to the collector electrode 431 through the input portion C1, and the current path length from the output terminal O to the collector electrode 441 through the input portion C1 to be equal to each other. Therefore, the internal resistances and the inductances from the output terminal O to the semiconductor elements can be made uniformed.

As illustrated in FIG. 5, each of the controlling conductive patterns 16 is provided in a region between the first semiconductor element 41 and the second semiconductor element 42. As a result, the current path length from each of the controlling conductive patterns 16 to the associated gate electrode 412 and the current path length from the controlling conductive pattern 16 to the associated gate electrode 422 can be easily equalized. Furthermore, the gate electrodes 412 and 432 are close to each other and the gate electrodes 422 and 442 are close to each other. Accordingly, the current path length from the controlling conductive pattern 16 to the gate electrode 412, the current path length from the controlling conductive pattern 16 to the gate electrode 422, the current path length from the controlling conductive pattern 16 to the gate electrode 432, and the current path length from the controlling conductive pattern 16 to the gate electrode 442 can be easily equalized. The controlling conductive pattern 16 is configured to cause the current path lengths to be substantially equal. Therefore, the lengths of the wires 511, 521, 531, and 541 are substantially equal.

Similarly, each of the first auxiliary emitter conductive patterns 15 is provided in a region between the first semiconductor element 41 and the second semiconductor element 42. Therefore, the current path length from each of the first auxiliary emitter conductive patterns 15 to the associated emitter electrode 413 and the current path length from the first auxiliary emitter conductive pattern 15 to the associated emitter electrode 423 can be easily equalized. Furthermore, the emitter electrodes 413 and 433 are close to each other and the emitter electrodes 423 and 443 are close to each other. Accordingly, the current path length from the first auxiliary emitter conductive pattern 15 to the emitter electrode 413, the current path length from the first auxiliary emitter conductive pattern 15 to the emitter electrode 423, the current path length from the first auxiliary emitter conductive pattern 15 to the emitter electrode 433, and the current path length from the first auxiliary emitter conductive pattern 15 to the emitter electrode 443 can be easily equalized. Therefore, the lengths of the wires 513, 523, 533, and 543 are substantially equal.

The substantially equal lengths of the wires 511, 521, 531, and 541 enable the inductances of these wires to be uniform. Accordingly, timings of switching thereof, and the voltages at the ON time thereof can be uniform. Therefore, increase of the temperature of any of the semiconductor elements to be higher than those of other semiconductor elements can be more effectively suppressed. Similarly, the substantially equal lengths of the wires 513, 523, 533, and 543 enable the inductances of these wires to be uniformed. As a result, timings of switching thereof, and the voltages at the ON time thereof can be uniform. Increase of the temperature of any of the semiconductor elements to be higher than those of other semiconductor elements can be more effectively suppressed.

As illustrated in FIG. 5, the controlling conductive pattern 16 of the first unit 10a, the controlling conductive pattern 16 of the second unit 10b, the second auxiliary emitter conductive pattern 17 of the first unit 10a, and the second auxiliary emitter conductive pattern 17 of the second unit 10b are closer to the center C0 than the conductive pattern 12 of the first unit 10*a* and the conductive pattern 12 of the second unit 10*b* are. The controlling conductive pattern 16 and the second auxiliary emitter conductive pattern 17 are less likely to generate heat than the semiconductor elements. Accordingly, increase of the temperature of the semiconductor module 1 can be suppressed by arrangement of the controlling conductive pattern 16 and the second auxiliary emitter conductive pattern 17 that are less likely to generate heat at locations closer to the center C0.

The first connecting line 30*a* illustrated in FIGS. 1 and 8 electrically connects the first power collecting portion 130*a*, the first power collecting portion 130*b*, the second power collecting portion 140*a*, and the second power collecting portion 140*b* included in the first unit 10*a* to the conductive pattern 12 included in the second unit 10*b*. The second connecting line 30*b* illustrated in FIGS. 1 and 9 electrically connects the first power collecting portion 130*a*, the first power collecting portion 130*b*, the second power collecting portion 140*a*, and the second power collecting portion 140*b* included in the second unit 10*b* to the negative terminal conductive pattern 18 included in the first unit 10*a*. The first connecting line 30*a* and the second connecting line 30*b* overlap with the conductive pattern 12 of the first unit 10*a* and the conductive pattern 12 of the second unit 10*b* in plan view.

Due to overlapping of the first connecting line 30*a* and the second connecting line 30*b* with the conductive patterns 12 in planarity in plan view, the first connecting line 30*a* and the second connecting line 30*b* are three-dimensionally arranged with respect to the conductive patterns 12. With the three-dimensional arrangement, heat sources can be dispersed and increase in temperature can be suppressed, for example, as compared to a case in which the first unit 10*a* and the second unit 10*b* are electrically connected by a wire. Furthermore, by forming each of the first connecting line 30*a* and the second connecting line 30*b* of a lead frame that is made of copper or the like and that is low in the resistance, generation of heat can be further reduced and increase in temperature of the semiconductor module 1 can be more effectively suppressed.

2. Second Embodiment

A second embodiment of the present disclosure is explained below. In the embodiment exemplified below, elements substantially the same in the action and the function as the elements described in the first embodiment described above are denoted by reference signs used in the explanations of the first embodiment described above and explanations thereof are omitted as appropriate.

The second embodiment is substantially the same as the first embodiment except that the third semiconductor element 43 and the fourth semiconductor element 44 are omitted and that configurations of a first connecting line 30*a*A and a second connecting line 30*b*A are different.

Figure 12:
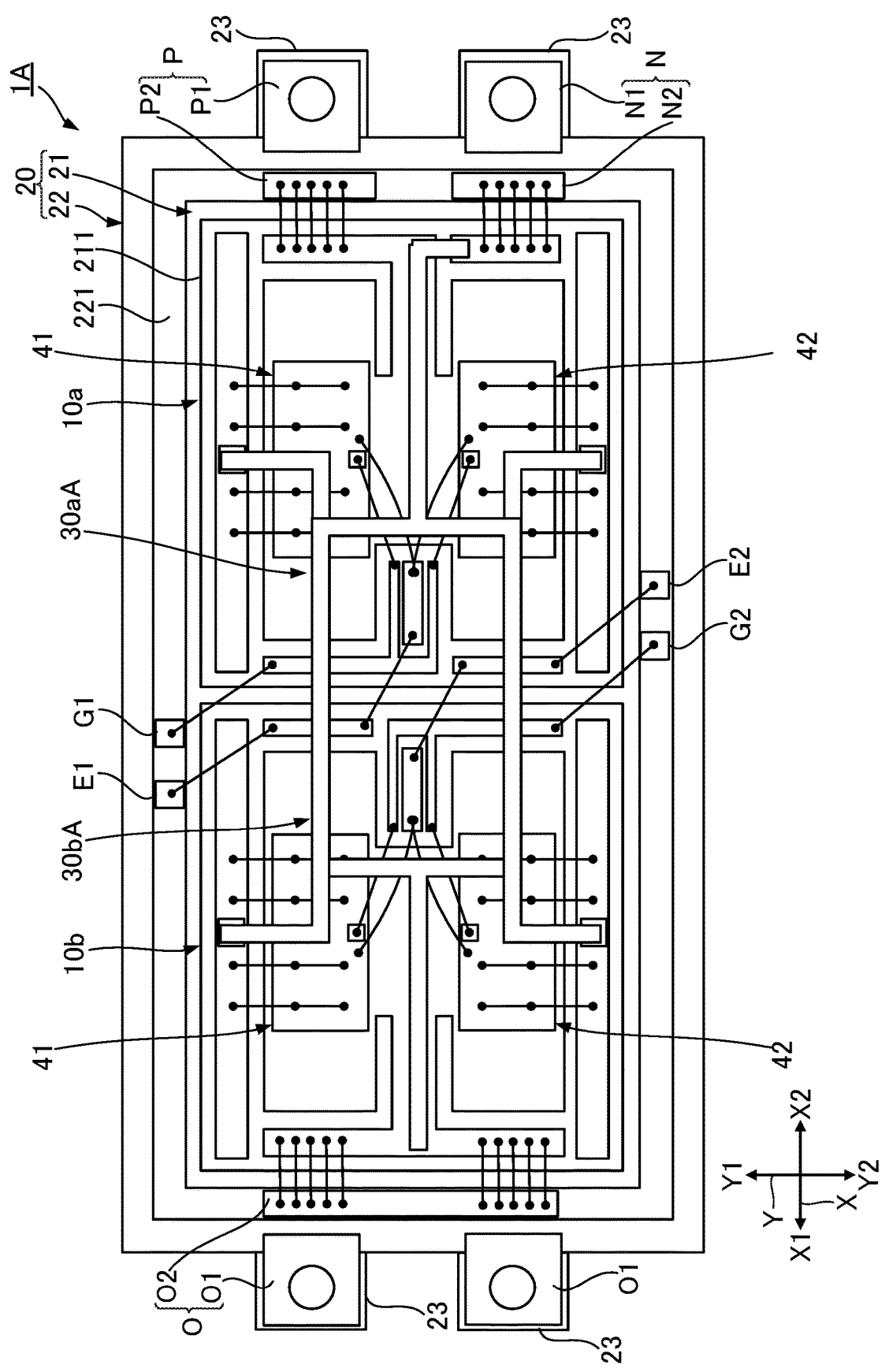
FIG. 12 is a plan view of a semiconductor module according to a second embodiment.

FIG. 12 is a plan view of a semiconductor module according to the second embodiment. As illustrated in FIG. 12, a semiconductor module 1A has the first semiconductor element 41 and the second semiconductor element 42. The first semiconductor element 41 and the second semiconductor element 42 are dispersedly arranged in each of the units. Specifically, the first semiconductor element 41 and the second semiconductor element 42 are dispersedly arranged to equalize the distance from the input portion C1 to the first semiconductor element 41 and the distance from the input portion C1 to the second semiconductor element 42. The input portion C1 is arranged between the first semiconductor element 41 and the second semiconductor element 42.

Figure 13:
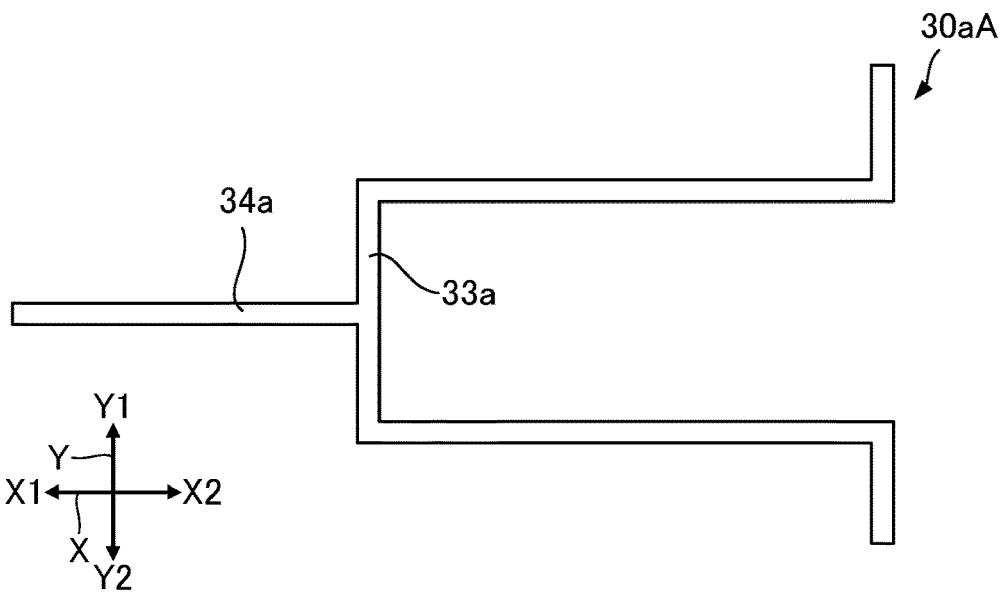
FIG. 13 is a plan view of a first connecting line illustrated in FIG. 12.

FIG. 13 is a plan view of the first connecting line 30*a*A illustrated in FIG. 12. In the first connecting line 30*a*A illustrated in FIG. 13, the first part 31*a* and the second part 32*a* in the first embodiment are omitted. The first connecting line 30*a*A has the third part 33*a* and the fourth part 34*a*. The third part 33*a* is electrically connected to a first power collecting portion 130 of the first outputting conductive pattern 13 and a second power collecting portion 140 of the second outputting conductive pattern 14.

Figure 14:
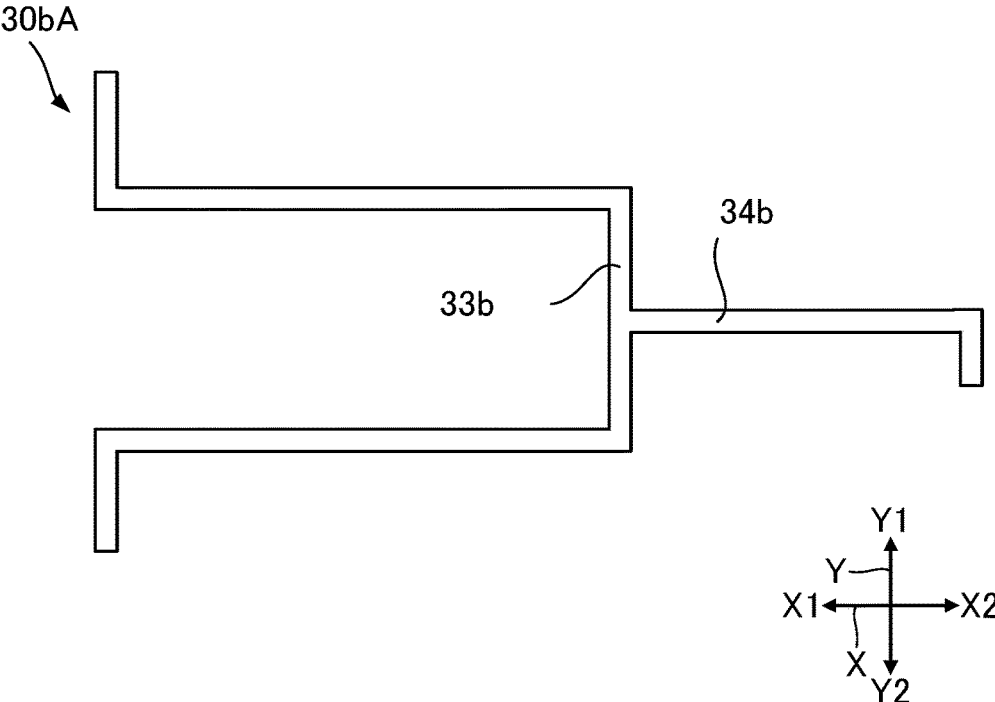
FIG. 14 is a plan view of a second connecting line illustrated in FIG. 12.

FIG. 14 is a plan view of the second connecting line 30*b*A illustrated in FIG. 12. In the second connecting line 30*b*A illustrated in FIG. 14, the first part 31*b* and the second part 32*b* in the first embodiment are omitted. As a result, the second connecting line 30*b*A has the third part 33*b* and the fourth part 34*b*. The third part 33*b* is electrically connected to the first power collecting portion 130 of the first outputting conductive pattern 13 and the second power collecting portion 140 of the second outputting conductive pattern 14.

Figure 15:
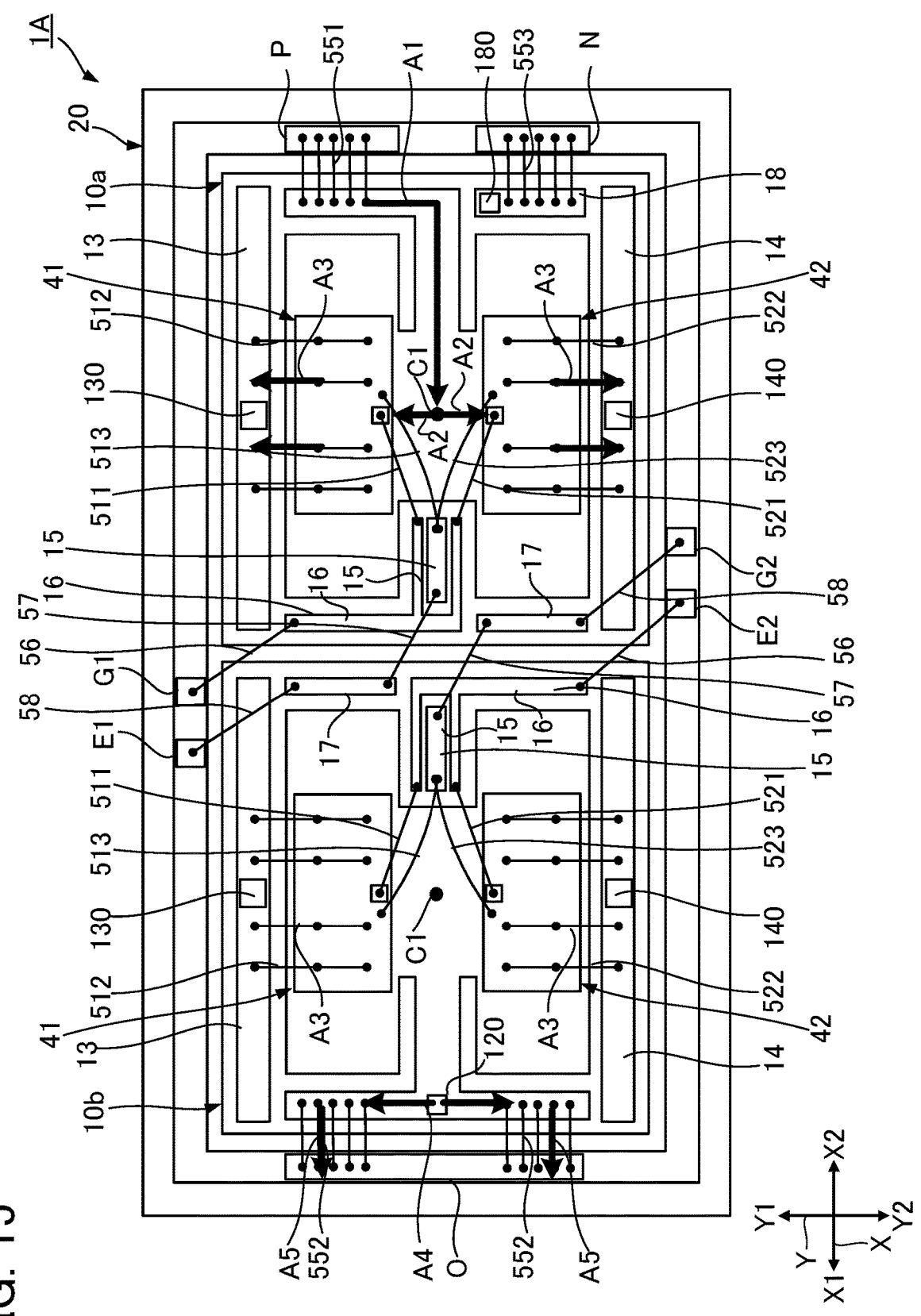
FIG. 15 is a diagram for explaining a flow of current in the upper arm.

FIG. 15 is a diagram for explaining a flow of current in the upper arm. Similarly to the first embodiment, when a current flows from the positive power-supply terminal P to the output terminal O, the current flows as indicated by arrows A1, A2, and A3 in FIG. 15 in this order, and the current subsequently passes through the first connecting line 30*a*A illustrated in FIGS. 12 and 13 to flow as indicated by arrows A4 and A5 in FIG. 15 in this order.

Figure 16:
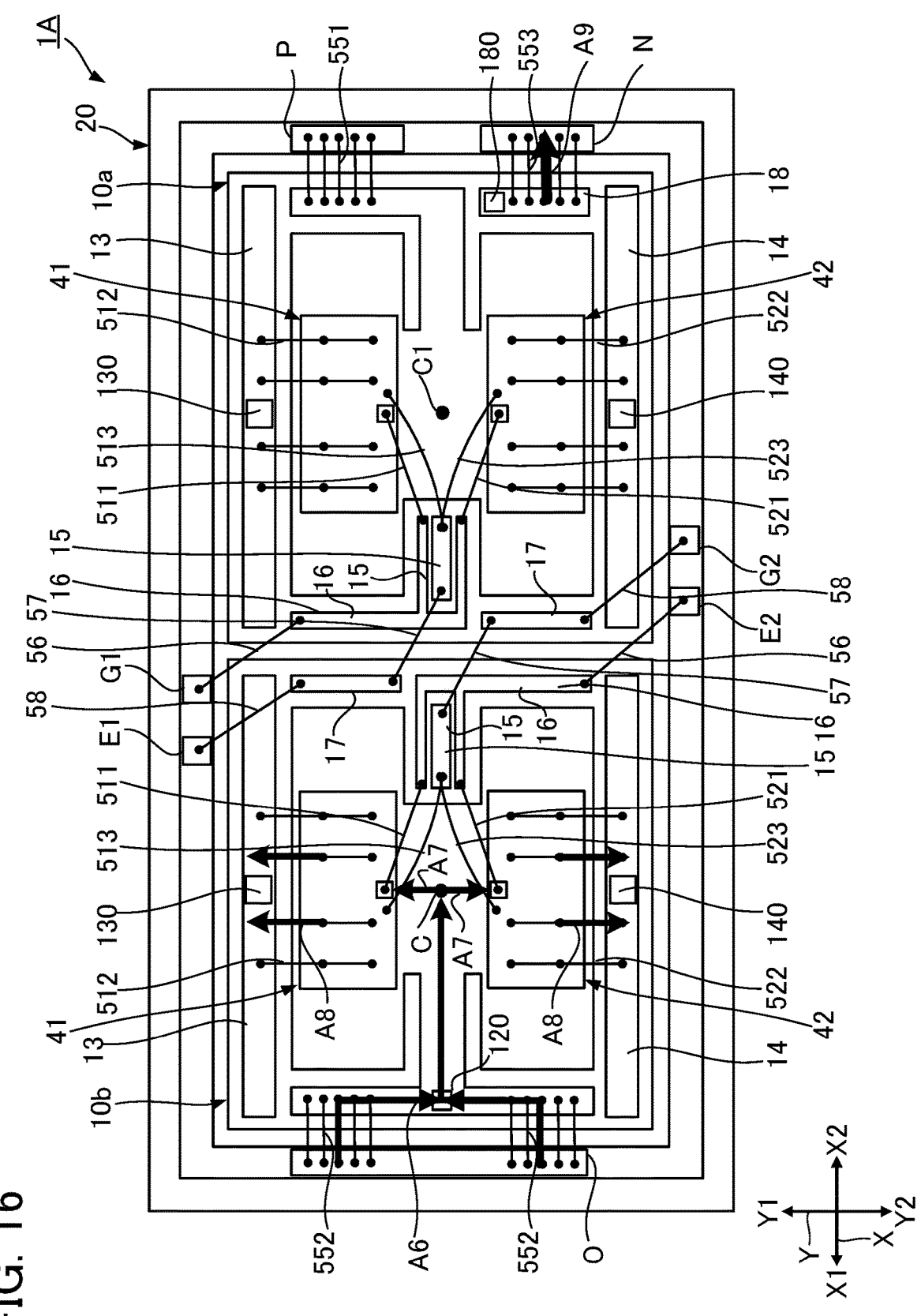
FIG. 16 is a diagram for explaining a flow of current in the lower arm.

FIG. 16 is a diagram for explaining a flow of current in the lower arm. Similarly to the first embodiment, when a current flows from the output terminal O to the negative power-supply terminal N, the current flows as indicated by arrows A6, A7, and A8 in FIG. 16 in this order, and the current subsequently passes through the second connecting line 30*b*A illustrated in FIGS. 12 and 14 to flow in a direction indicated by an arrow A9 in FIG. 16.

In the present embodiment, similarly to the first embodiment, the conductive pattern 12 is disposed between the first outputting conductive pattern 13 and the second outputting conductive pattern 14. The following two current path lengths are equal to each other: (i) the current path length from the emitter electrode 413 to the first power collecting portion 130 on the first outputting conductive pattern 13, and (ii) the current path length from the emitter electrode 423 to the second power collecting portion 140 on the second outputting conductive pattern 14. As a result, it is possible to make uniform the internal resistances and the inductances from the first semiconductor element 41 to the first power collecting portion 130 on the first outputting conductive pattern 13 and from the second semiconductor element 42 to the second power collecting portion 140 on the second outputting conductive pattern 14. Furthermore, current imbalance between the first semiconductor element 41 and the second semiconductor element 42 can be suppressed. This enables the temperature of the semiconductor module 1A to be decreased.

By making the inductances in outputs from the semiconductor elements uniformed on the main current path as described above, current sharing between the semiconductor elements can be equalized. Accordingly, increase of the temperatures of the semiconductor elements can be suppressed. The reliability of the semiconductor module 1A can be enhanced.

Since the first outputting conductive pattern 13 and the second outputting conductive pattern 14 are provided on an outer side of the conductive pattern 12, concentration of the wires 512 and 522 near the center of the conductive pattern 12 can be avoided. As a result, heat interference between the wires can be suppressed.

As described above, the input portion C1 is closer to the center of the conductive pattern 12 in plan view than the collector electrodes 411 and 421 are. The current path length from the input portion C1 to the collector electrode 411 and the current path length from the input portion C1 to the collector electrode 421 are equal to each other. This enables the internal resistances and the inductances from the input portion C1 to the semiconductor elements to be uniform. Accordingly, current imbalance between the first semiconductor element 41 and the second semiconductor element 42 can be suppressed. The temperature of the semiconductor module 1A can be decreased.

Thus, current sharing between the semiconductor elements can be equalized by making the inductances in inputs to the semiconductor elements uniform on the main current path. In particular, by making uniform the inductances in the inputs to the semiconductor elements in addition to the inductances in the outputs from the semiconductor elements, equalizing of current sharing between the semiconductor elements can be realized particularly effectively.

The semiconductor elements are provided between the first power collecting portion 130 and the second power collecting portion 140. In contrast, the input portion C1 is closer to the center of the conductive pattern 12 than the semiconductor elements are. As a result, the input paths of the current to the semiconductor elements can be isolated from the output paths of the current from the semiconductor elements. Heat interference of various wires can be suppressed. This enables the temperature of the semiconductor module 1A to be decreased.

Since current imbalance between the semiconductor elements can be suppressed in the second embodiment, similarly to the first embodiment, increase of the temperature of the semiconductor module 1 can be suppressed. The reliability of the semiconductor module 1A can be enhanced.

3. Modifications

Each of the embodiments described above may be variously modified as described below. Furthermore, such modifications may be combined with one another as appropriate.

Although each of the first semiconductor element 41, the second semiconductor element 42, the third semiconductor element 43, and the fourth semiconductor element 44 includes an RC-IGBT, a MOSFET may be included therein. It suffices for the body diode of the MOSFET to function as an FWD similarly to a diode of an RC-IGBT in which an IGBT and the diode are integrally formed. In the case of a MOSFET, each of the semiconductor elements includes a drain electrode instead of the collector electrode, and a source electrode instead of the emitter electrode. In this case, the drain electrode of the first semiconductor element 41 corresponds to the "first input electrode," the drain electrode of the second semiconductor element 42 corresponds to the "second input electrode," the drain electrode of the third semiconductor element 43 corresponds to the "third input electrode," and the drain electrode of the fourth semiconductor element 44 corresponds to the "fourth input electrode." The source electrode of the first semiconductor element 41 corresponds to the "first output electrode," the source electrode of the second semiconductor element 42 corresponds to the "second output electrode," the source electrode of the third semiconductor element 43 corresponds to the "third output electrode," and the source electrode of the fourth semiconductor element 44 corresponds to the "fourth output electrode."

Although the number of the semiconductor elements included in each of the units is two or four, the number of the semiconductor elements may be three or five or more. In the second embodiment, the first semiconductor element 41 and the second semiconductor element 42 are arrayed along the Y-axis. However, the first semiconductor element 41 and the second semiconductor element 42 may be arrayed along the X-axis.

Although the present invention is described on the basis of illustrated embodiments, it is not limited to the above embodiments. The configurations of respective parts of the present invention may be replaced with freely chosen configurations exhibiting functions substantially similar to those of the foregoing embodiments. Freely chosen configuration can be added to these parts.

DESCRIPTION OF REFERENCE SIGNS

1 . . . semiconductor module, 1A . . . semiconductor module, 10*a* . . . first unit, 10*b* . . . second unit, 11 . . . insulating substrate, 12 . . . conductive pattern, 13 . . . first outputting conductive pattern, 14 . . . second outputting conductive pattern, 15 . . . first auxiliary emitter conductive pattern, 16 . . . controlling conductive pattern, 17 . . . second auxiliary emitter conductive pattern, 18 . . . negative terminal conductive pattern, 19 . . . metallic plate, 20 . . . case, 21 . . . dissipating substrate, 22 . . . sidewall, 23 . . . protruding piece, 30*a* . . . first connecting line, 30*a*A . . . first connecting line, 30*b* . . . second connecting line, 30*b*A . . . second connecting line, 31*a* . . . first part, 31*b* . . . first part, 32*a* . . . second part, 32*b* . . . second part, 33*a* . . . third part, 33*b* . . . third part, 34*a* . . . fourth part, 34*b* . . . fourth part, 41 . . . first semiconductor element, 42 . . . second semiconductor element, 43 . . . third semiconductor element, 44 . . . fourth semiconductor element, 120 . . . terminal join portion, 121 . . . arrangement portion, 122 . . . first connection portion, 123 . . . second connection portion, 125 . . . slit, 130 . . . first power collecting portion, 140 . . . second power collecting portion, 130*a* . . . first power collecting portion, 140*a* . . . second power collecting portion, 130*b* . . . first power collecting portion, 140*b* . . . second power collecting portion, 180 . . . terminal join portion, 211 . . . upper surface, 221 . . . stepped surface, 411 . . . collector electrode, 412 . . . gate electrode, 413 . . . emitter electrode, 421 . . . collector electrode, 422 . . . gate electrode, 423 . . . emitter electrode, 431 . . . collector electrode, 432 . . . gate electrode, 433 . . . emitter electrode, 441 . . . collector electrode, 442 . . . gate electrode, 443 . . . emitter electrode, 511 . . . wire, 512 . . . wire, 513 . . . wire, 521 . . . wire, 522 . . . wire, 523 . . . wire, 531 . . . wire, 532 . . . wire, 533 . . . wire, 541 . . . wire, 542 . . . wire, 543 . . . wire, 551 . . . wire, 552 . . . wire, 553 . . . wire, 56 . . . wire, 57 . . . wire, 58 . . . wire, A . . . upper arm, B . . . lower arm, C1 . . . input portion, D1 . . . diode, D2 . . . diode, E1 . . . auxiliary emitter terminal, E2 . . . auxiliary emitter terminal, G1 . . . control terminal, G2 . . . control terminal, N . . . negative power-supply terminal, N1 . . . first terminal, N2 . . . second terminal, O . . . output terminal, O1 . . . first terminal, O2 . . . second terminal, P . . . positive power-supply terminal, P1 . . .

first terminal, P2 . . . second terminal, T1 . . . transistor, T2 . . . transistor, S1 . . . virtual rectangle.

What is claimed is:

1. A semiconductor module comprising:
an insulating substrate;
a conductive pattern on the insulating substrate;
a first semiconductor element on the conductive pattern, the first semiconductor element including a first input electrode, a first output electrode, and a first control electrode;
a second semiconductor element on the conductive pattern, the second semiconductor element including a second input electrode, a second output electrode, and a second control electrode;
a first power collecting portion electrically connected to the first output electrode with a first line; and
a second power collecting portion electrically connected to the second output electrode with a second line, wherein:
    each of the first semiconductor element and the second semiconductor element includes both a switching element and a diode,
    the conductive pattern is provided between the first power collecting portion and the second power collecting portion,
    a current path length from the first output electrode to the first power collecting portion and a current path length from the second output electrode to the second power collecting portion are equal to each other,
    the first power collecting portion and the second power collecting portion are arranged along a first axis,
    the first semiconductor element and the second semiconductor element are arranged along the first axis between the first power collecting portion and the second power collecting portion,
    the first semiconductor element is positioned closer to the first power collecting portion than the second power collecting portion, and
    the second semiconductor element is positioned closer to the second power collecting portion than the first power collecting portion.

2. The semiconductor module according to claim 1, wherein:
the conductive pattern includes an input portion to be electrically connected to an input terminal,
the first input electrode is formed on a surface of the first semiconductor element facing the conductive pattern and is electrically connected to the input portion,
the second input electrode is formed on a surface of the second semiconductor element facing the conductive pattern and is electrically connected to the input portion,
the input portion is closer to a center of the conductive pattern than the first input electrode and the second input electrode are in plan view, and
a current path length from the input portion to the first input electrode and a current path length from the input portion to the second input electrode are equal to each other.

3. The semiconductor module according to claim 2, wherein:
the conductive pattern includes a slit, and
the slit extends along a direction from the input terminal to the input portion such that a current path length from the input terminal to the first input electrode through the input portion is equal to a current path length from the input terminal to the second input electrode through the input portion.

4. The semiconductor module according to claim 1, further comprising:
a third semiconductor element on the conductive pattern, the third semiconductor element including a third input electrode, a third output electrode, and a third control electrode; and
a fourth semiconductor element on the conductive pattern, the fourth semiconductor element including a fourth input electrode, a fourth output electrode, and a fourth control electrode, wherein:
    the third output electrode is electrically connected to the first power collecting portion with a third line,
    the fourth output electrode is electrically connected to the second power collecting portion with a fourth line, and
    the following current path lengths are equal to each other:
        a current path length from the first output electrode to the first power collecting portion;
        a current path length from the second output electrode to the second power collecting portion;
        a current path length from the third output electrode to the first power collecting portion; and
        a current path length from the fourth output electrode to the second power collecting portion.

5. The semiconductor module according to claim 4, wherein:
the conductive pattern includes an arrangement portion for arranging:
    the first semiconductor element;
    the second semiconductor element;
    the third semiconductor element; and
    the fourth semiconductor element,
the first semiconductor element is provided at a first corner of a virtual rectangle along an outer edge of the arrangement portion,
the second semiconductor element is provided at a second corner of the virtual rectangle,
the third semiconductor element is provided at a third corner of the virtual rectangle, and
the fourth semiconductor element is provided at a fourth corner of the virtual rectangle.

6. The semiconductor module according to claim 3, further comprising a controlling conductive pattern on the insulating substrate, wherein:
the first control electrode is electrically connected to the controlling conductive pattern with a controlling line,
the second control electrode is electrically connected to the controlling conductive pattern with a controlling line, and
the controlling conductive pattern is on the insulating substrate and is provided in a region between the first semiconductor element and the second semiconductor element.

7. The semiconductor module according to claim 6, further comprising:
a first unit; and
a second unit, wherein:
    each of the first unit and the second unit includes:
        the insulating substrate;
        the conductive pattern;
        the first semiconductor element;
        the second semiconductor element;
        the first power collecting portion;

the second power collecting portion; and the controlling conductive pattern, and the controlling conductive pattern of the first unit and the controlling conductive pattern of the second unit are closer to an intermediate point between the first unit and the second unit than the conductive pattern of the first unit and the conductive pattern of the second unit are.

8. The semiconductor module according to claim 7, further comprising a connecting line for electrically connecting the first power collecting portion and the second power collecting portion included in the first unit to the conductive pattern included in the second unit, wherein the connecting line overlaps with the conductive pattern of the first unit and the conductive pattern of the second unit in plan view.

\* \* \* \* \*